US012796087B2

(12) United States Patent
Wang et al.

(10) Patent No.: US 12,796,087 B2

(45) Date of Patent: Nov. 10, 2026

(54) ARRAY SUBSTRATE HAVING A UNIQUE VOLTAGE SUPPLY LINE STRUCTURE

(71) Applicants: Chengdu BOE Optoelectronics Technology Co., Ltd., Chengdu (CN); BOE Technology Group Co., Ltd., Beijing (CN)

(72) Inventors: Siyu Wang, Beijing (CN); Yi Zhang, Beijing (CN); Chang Luo, Beijing (CN); Yang Xu, Beijing (CN); Jiaxing Chen, Beijing (CN); Maoying Liao, Beijing (CN); Junxiu Dai, Beijing (CN); Yi Qu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 565 days.

(21) Appl. No.: 17/607,399

(22) PCT Filed: Jan. 29, 2021

(86) PCT No.: PCT/CN2021/074436

§ 371 (c)(1),
(2) Date: Oct. 29, 2021

(87) PCT Pub. No.: WO2022/160255

PCT Pub. Date: Aug. 4, 2022

(65) Prior Publication Data

US 2023/0138949 A1 May 4, 2023

(51) Int. Cl.
*H10D 86/60* (2025.01)
*H10D 86/40* (2025.01)

(52) U.S. Cl.
CPC .......... *H10D 86/60* (2025.01); *H10D 86/441* (2025.01)

(58) Field of Classification Search
None
See application file for complete search history.

(56) References Cited

U.S. PATENT DOCUMENTS

2013/0228777 A1* 9/2013 Yamazaki .......... H01L 33/0041 257/43
2016/0254340 A1 9/2016 Kwon et al.
(Continued)

FOREIGN PATENT DOCUMENTS

CN 107452773 A 12/2017
CN 108511497 A 9/2018
(Continued)

OTHER PUBLICATIONS

International Search Report & Written Opinion mailed Jan. 29, 2021, regarding PCT/CN20121/074436.

*Primary Examiner* — Sue A Purvis
*Assistant Examiner* — Seyon Ali-Simah Punchbeddell
(74) *Attorney, Agent, or Firm* — Intellectual Valley Law, P.C.

(57) ABSTRACT

An array substrate is provided. The array substate includes a base substrate; a semiconductor material layer on the base substrate; and a plurality of voltage supply lines on a side of the semiconductor material layer away from the base substrate. In a respective subpixel, the semiconductor material layer includes an active layer of a third transistor, an active layer of a fifth transistor, an active layer of a driving transistor, and a third node portion that is connected to the active layer of the third transistor, the active layer of the fifth transistor, and the active layer of the driving transistor in the respective subpixel. At least 30% of an orthographic projection of the third node portion on the base substrate is non-overlapping with an orthographic projection of a respective voltage supply line on the base substrate.

20 Claims, 24 Drawing Sheets

(56) References Cited

U.S. PATENT DOCUMENTS

| | | | | |
|---|---|---|---|---|
| 2017/0287996 | A1* | 10/2017 | Kim | H01L 27/1222 |
| 2017/0330927 | A1 | 11/2017 | Lee et al. | |
| 2017/0345877 | A1 | 11/2017 | Hwang | |
| 2019/0043937 | A1* | 2/2019 | Lee | G09G 3/3291 |
| 2019/0172895 | A1 | 6/2019 | Liu | |
| 2020/0176535 | A1* | 6/2020 | Eom | H01L 29/78642 |
| 2020/0203461 | A1 | 6/2020 | Chen et al. | |
| 2020/0411611 | A1 | 12/2020 | Liu et al. | |
| 2021/0233989 | A1 | 7/2021 | Li et al. | |
| 2021/0320166 | A1* | 10/2021 | Zhao | H01L 25/18 |
| 2022/0271107 | A1* | 8/2022 | Liu | H10K 59/65 |

FOREIGN PATENT DOCUMENTS

| | | | | | |
|---|---|---|---|---|---|
| CN | 109004012 | A | | 12/2018 | |
| CN | 109786434 | A | | 5/2019 | |
| CN | 110034132 | A | * | 7/2019 | G02F 1/1362 |
| CN | 110265410 | A | | 9/2019 | |
| CN | 110265458 | A | * | 9/2019 | G06K 9/00013 |
| CN | 111276511 | A | | 6/2020 | |
| CN | 111403465 | A | | 7/2020 | |
| CN | 111477669 | A | | 7/2020 | |
| CN | 112259595 | A | | 1/2021 | |
| IN | 107369690 | A | | 11/2017 | |

* cited by examiner

ARRAY SUBSTRATE HAVING A UNIQUE VOLTAGE SUPPLY LINE STRUCTURE

CROSS-REFERENCE TO RELATED APPLICATION

This application is a national stage application under 35 U.S.C. § 371 of International Application No. PCT/CN2021/074436, filed Jan. 29, 2021, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the diving transistor outputs a current corresponding to the data voltage to an OLED device. The OLED device is driven to emit light of a corresponding brightness.

SUMMARY

In one aspect, the present disclosure provides an array substrate, comprising a base substrate; a semiconductor material layer on the base substrate; and a plurality of voltage supply lines on a side of the semiconductor material layer away from the base substrate; wherein, in a respective subpixel, the semiconductor material layer comprises an active layer of a third transistor, an active layer of a fifth transistor, an active layer of a driving transistor, and a third node portion that is connected to the active layer of the third transistor, the active layer of the fifth transistor, and the active layer of the driving transistor in the respective subpixel, and at least 30% of an orthographic projection of the third node portion on the base substrate is non-overlapping with an orthographic projection of a respective voltage supply line on the base substrate.

Optionally, the third node portion comprises contiguously a first portion and a second portion: the first portion is connected to the active layer of the fifth transistor, the active layer of the driving transistor, and the second portion; the second portion connects the first portion to the active layer of the third transistor; and an orthographic projection of the first portion is non-overlapping with the orthographic projection of the respective voltage supply hue on the base substrate.

Optionally, the array substrate further comprises a gate insulating layer on a side of the semiconductor material layer away from the base substrate; and a plurality of gate lines on a side of the gate insulating layer away from the base substrate: wherein an orthographic projection of the active layer of the third transistor on the base substrate overlaps with an orthographic projection of a respective gate line on the base substrate; and an orthographic projection of the active layer of the fifth transistor on the base substrate overlaps with an orthographic projection of a respective light emitting control signal line on the base substrate.

Optionally, in the respective subpixel, the respective voltage supply line comprises contiguously a first wide portion, a narrow portion, and a second wide portion; wherein an orthographic projection of the first wide portion on the base substrate is at least partially overlapping with an orthographic projection of the second portion on the base substrate; an orthographic projection of the narrow portion on the base substrate is non-overlapping with an orthographic projection of the semiconductor material layer on the base substrate; an orthographic projection of the second wide portion on the base substrate is at least partially overlapping with an orthographic projection of the active layer of the fifth transistor on the base substrate and an orthographic projection of a respective light emitting control signal line on the base substrate; and the narrow portion has an average line width smaller than an average line width of the first wide portion and smaller than an average line width of the second wide portion.

Optionally, the array substrate further comprises an insulating layer on a side of the semiconductor material layer away from the base substrate; a second capacitor electrode of a storage capacitor on a side of the insulating layer away from the base substrate; and an inter-layer dielectric layer on a side of the second capacitor electrode away from the base substrate; wherein the first wide portion connects to the second capacitor electrode of a storage capacitor through a ninth via extending through the inter-layer dielectric layer.

Optionally, in the respective subpixel, the respective voltage supply line further comprises a first segment connected to the first wide portion; and an orthographic projection of the first segment on the base substrate is at least partially overlapping with an orthographic projection of the active layer of the third transistor on the base substrate and an orthographic, projection of a respective gate line on the base substrate.

Optionally, in an adjacent subpixel immediately adjacent to the respective subpixel, the semiconductor material layer comprises an active layer of a second transistor, an active layer of a fourth transistor, an active layer of a driving transistor, and a second node portion that is connected to the active layer of the second transistor, the active layer of the fourth transistor, and the active layer of the driving transistor in the adjacent subpixel; and an orthographic projection of the second node portion on the base substrate is non-overlapping with the orthographic projection of the respective voltage supply line on the base substrate.

Optionally, at least a narrow portion of the respective voltage supply line in the respective subpixel is between the second node portion and the third node portion; and an orthographic projection of the narrow portion on the base substrate is non-overlapping with an orthographic projection of the second node portion on the base substrate, and is non-overlapping with an orthographic projection of the third node portion on the base substrate.

Optionally, the array substrate further comprises a plurality of gate lines on a side of the semiconductor material layer away from the base substrate; wherein, in the respective subpixel, a respective gate line comprises a main portion extending along an extension direction of the respective gate line, and a gate protrusion protruding away from the main portion; an orthographic projection of the gate protrusion on the base substrate at least partially overlaps with an orthographic projection of the active layer of the third transistor on the base substrate; and at least 90% of the orthographic projection of the gate protrusion on the base substrate is non-overlapping with an orthographic projection of a respective voltage supply line on the base substrate.

Optionally, the array substrate further comprises a plurality of reset control signal lines on a side of the semiconductor material layer away from the base substrate; wherein, in the respective subpixel, the respective voltage supply line comprises contiguously a third segment, a fourth segment, and a fifth segment, the fourth segment connecting the third segment and the fifth segment; an orthographic projection of the fourth segment on the base substrate is at least partially overlapping with an orthographic projection of a respective reset control signal line on the base substrate; and the fourth segment has an average line width smaller than an average line width of the third segment and smaller than an average line width of the fifth segment.

In another aspect, the present disclosure provides an array substrate, comprising a base substrate; a semiconductor material layer on the base substrate; a plurality of gate lines on a side of the semiconductor material layer away from the base substrate; and a plurality of voltage supply lines on a side of the plurality of gate lines away from the base substrate; wherein, in a respective subpixel, a respective gate line comprises a main portion extending along an extension direction of the respective gate line, and a gate protrusion protruding away from the main portion; wherein, in the respective subpixel, the semiconductor material layer comprises an active layer of a third transistor; an orthographic projection of the gate protrusion on the base substrate at least partially overlaps with an orthographic projection of the active layer of the third transistor on the base substrate; and at least 90% of the orthographic projection of the gate protrusion on the base substrate is non-overlapping with an orthographic projection of a respective voltage supply line on the base substrate.

Optionally, the orthographic projection of the gate protrusion on the base substrate is non-overlapping with the orthographic projection of the respective voltage supply line on the base substrate.

Optionally, the array substrate further comprises a plurality of reset control signal lines on a side of the semiconductor material layer away from the base substrate an interference preventing block on a side of the plurality of reset control signal lines away from the base substrate; and an inter-layer dielectric layer on a side of the interference preventing block away from the base substrate; wherein, in the respective subpixel, the respective voltage supply line comprises contiguously a first segment, a second segment, a third segment, and a fourth segment; wherein an orthographic projection of the first segment on the base substrate is at least partially overlapping with an orthographic projection of the active layer of the third transistor on the base substrate and at least partially overlapping with an orthographic projection of the respective gate line on the base substrate; an orthographic projection of the fourth segment on the base substrate is at least partially overlapping with an orthographic projection of a respective reset control signal line on the base substrate; the second segment connects the first segment to the third segment; the third segment connects the second segment to the fourth segment; and the third segment is connected to an interference preventing block through a third via extending through the inter-layer dielectric layer.

Optionally, the third segment has an average line width greater than an average line width of the second segment.

In another aspect, the present disclosure provides an array substrate, comprising a base substrate; a plurality of reset control signal lines on the base substrate; and a plurality of voltage supply lines on a side of the plurality of reset control signal lines away from the base substrate; wherein, in a respective subpixel, a respective voltage supply line comprises contiguously a third segment, a fourth segment, and a fifth segment, the fourth segment connecting the third segment and the fifth segment; an orthographic projection of the fourth segment on the base substrate is at least partially overlapping with an orthographic projection of a respective reset control signal, line on the base substrate; and the fourth segment has an average line width smaller than an average line width of the third segment and smaller than an average line width of the fifth segment.

Optionally, the array substrate further comprises a plurality of reset signal lines on a side of the plurality of reset control signal lines away from the base substrate; wherein an orthographic projection of the fifth segment on the base substrate is at least partially overlapping with an orthographic projection of a respective reset signal line on the base substrate.

Optionally, the array substrate further comprises an interference preventing block on a side of the plurality of reset control signal lines away from the base substrate; and an inter-layer dielectric layer on a side of the interference preventing block away from the base substrate; wherein the third segment connects to an interference preventing block through a third via extending through the inter-layer dielectric layer.

Optionally, the array substrate further comprises a semiconductor material layer on the base substrate; wherein, in a subpixel in a previous stage and immediately adjacent to the respective subpixel, the semiconductor material layer comprises an active layer of a sixth transistor; and an orthographic projection of the respective reset control signal line on the base substrate is at least partially overlapping with the orthographic projection of the active layer of the sixth transistor on the base substrate; and at least 80% of the orthographic projection of the active layer of the sixth transistor in the subpixel in the previous stage on the base substrate is non-overlapping with an orthographic projection of the fourth segment on the base substrate.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAIL ED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia array substrate and a display apparatus that substantially obviate one or more of the problems due to limitations and disadvantages of the related art. In one aspect, the present disclosure provides an array substrate. In some embodiments, the array substrate includes a base substrate; a semiconductor material layer on the base substrate; and a plurality of voltage supply lines on a side of the semiconductor material layer away from the base substrate. Optionally, in a respective subpixel, the semiconductor material layer includes an active layer of a third transistor, an active layer of a fifth transistor, an active layer of a driving transistor, a third node portion that is connected to the active layer of the third transistor, the active layer of the fifth transistor, and the active layer of the driving transistor in the respective subpixel. Optionally, at least 30% of an orthographic projection of the third node portion on the base substrate is non-overlapping with an orthographic projection of a respective voltage supply line on the base substrate.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
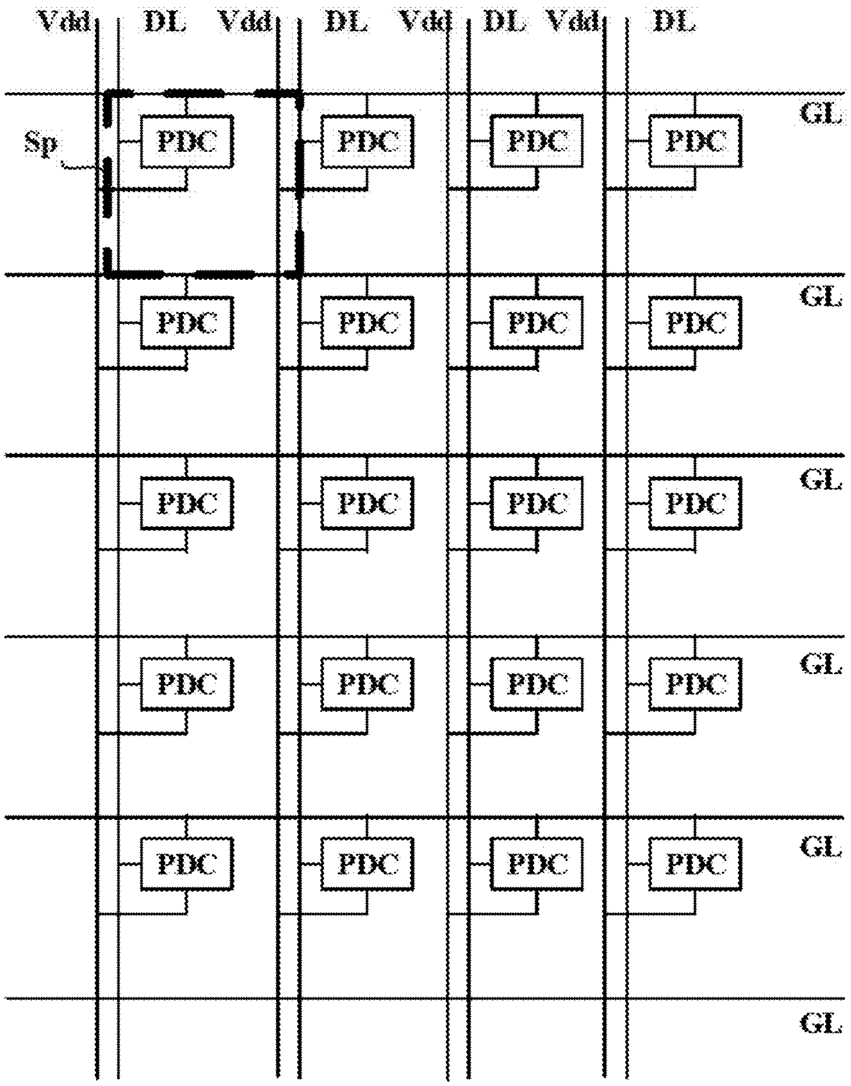
FIG. 1 is a plan view of an array substrate in sonic embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of sensing signal lines SL, a plurality of voltage supply line (e.g., a high voltage supply line Vdd), and a respective second Voltage supply line (e.g., a low voltage supply line Vss), each of which electrically connected to the respective pixel driving circuit PDC. Light emission in a respective subpixel sp is driven by a respective pixel driving circuit PDC. In one example, a high voltage signal (e.g., a VDD signal) is input, through the high voltage support line Vdd, to the respective pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage ΔV that drives light emission in the light emitting element. The array substrate according to the present disclosure includes a plurality of sensing signal lines SL respectively connected to sensing sub-circuits in the plurality of pixel driving circuits.

FIG. 2 is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage, a source electrode connected to a respective reset signal line VintN in a present stage of a plurality of reset signal line, and a drain electrode connected to a first capacitor electrode Ce1 of the storage capacitor Cst and a gate electrode of the driving transistor Td; a second transistor T2 having a gate electrode connected to a respective gate line of a plurality of wire lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a reset control signal line rst(N+1) in a next stage, a source electrode connected to a reset signal line Vint(N+1) in the next stage, and a drain electrode connected to the drain electrode of the fifth transistor and the anode of the light emitting element LE. The second capacitor electrode Ce2 is connected to the respective voltage supply line and the source electrode of the fourth transistor T4. The pixel driving circuit further includes a switching transistor Tw having a gate electrode connected to a switching control signal lines SW, a source electrode connected to the respective data line, and a drain electrode connected to the source electrode of the second transistor T2.

Figure 2A:
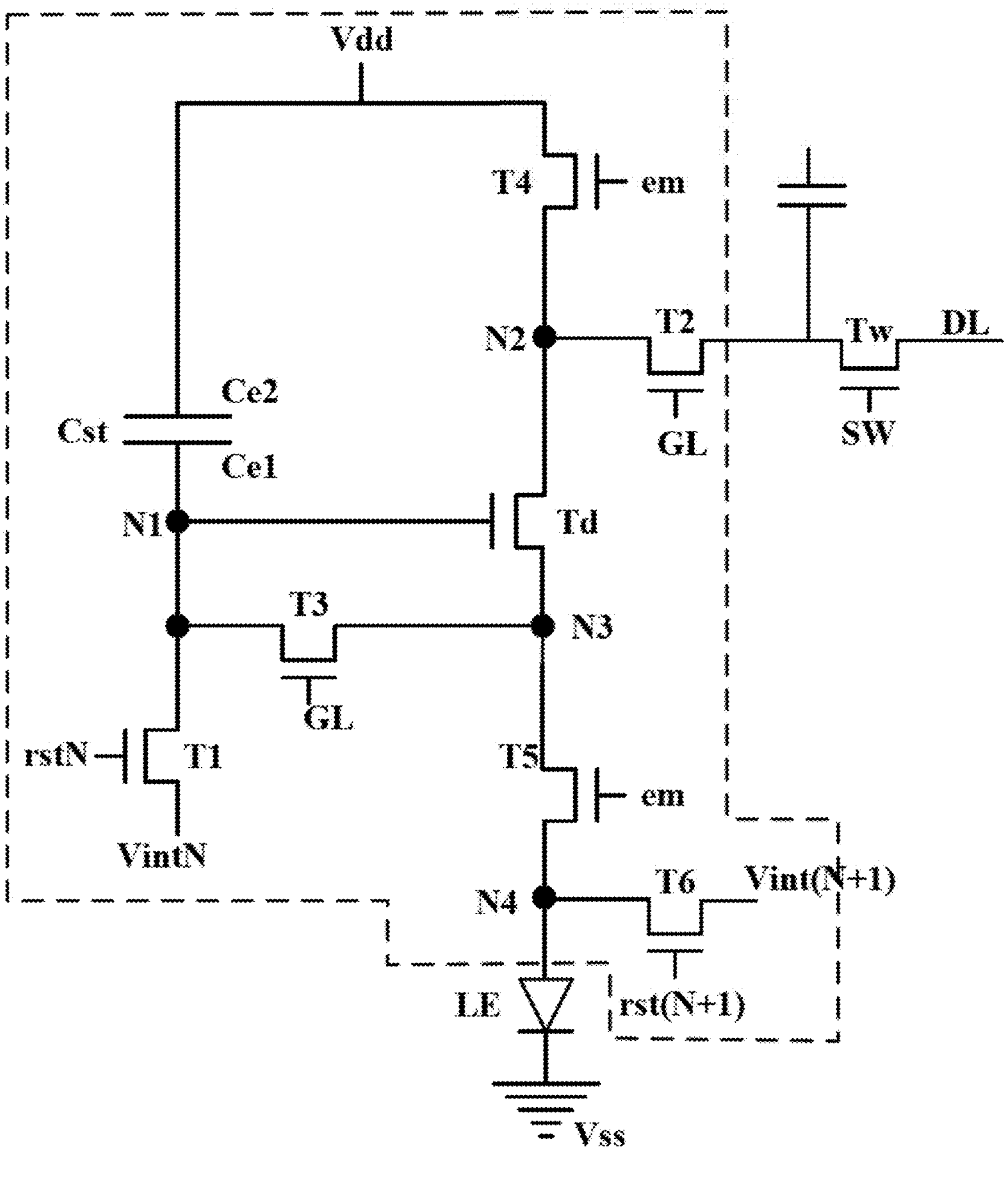
FIG. 2A is a circuit diagram illustrating the structure of a pixel driving circuit in some embodiments according to the present disclosure.
Figure 2B:
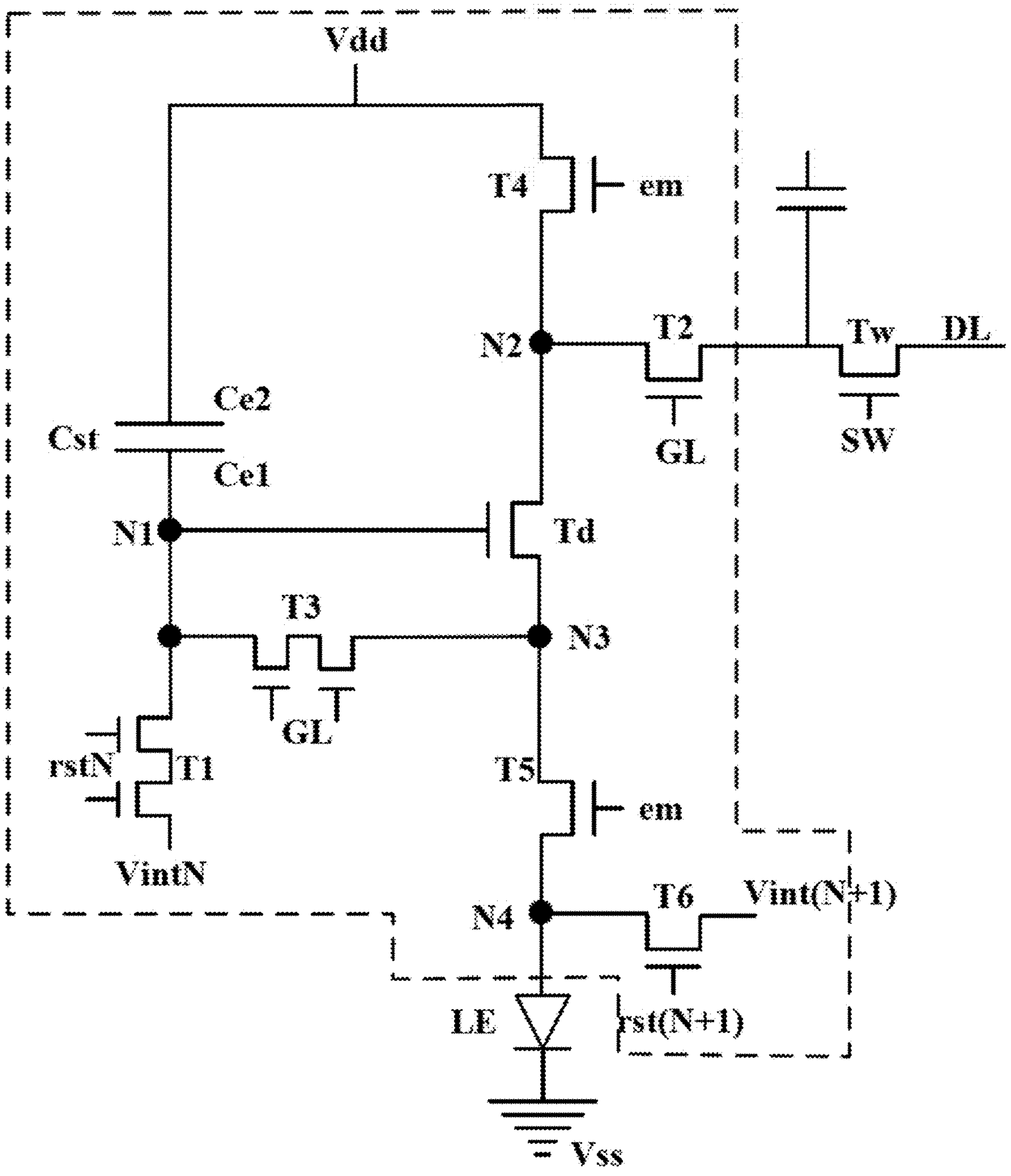
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring, to FIG. 2B, in some embodiments, the third transistor T3 is a “double gate” transistor, and the first transistor T1 is a “double gate” transistor. Optionally, in a “double gate” first transistor, the active layer of the first transistor crosses over a respective reset control signal lines twice (alternatively, the respective reset control signal line crosses over the active layer of the first transistor T1 twice). Similarly, in a “double gate” third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, the drain electrode of the sensing transistor Ts, and the anode of the light emitting element LE.

Figure 3A:
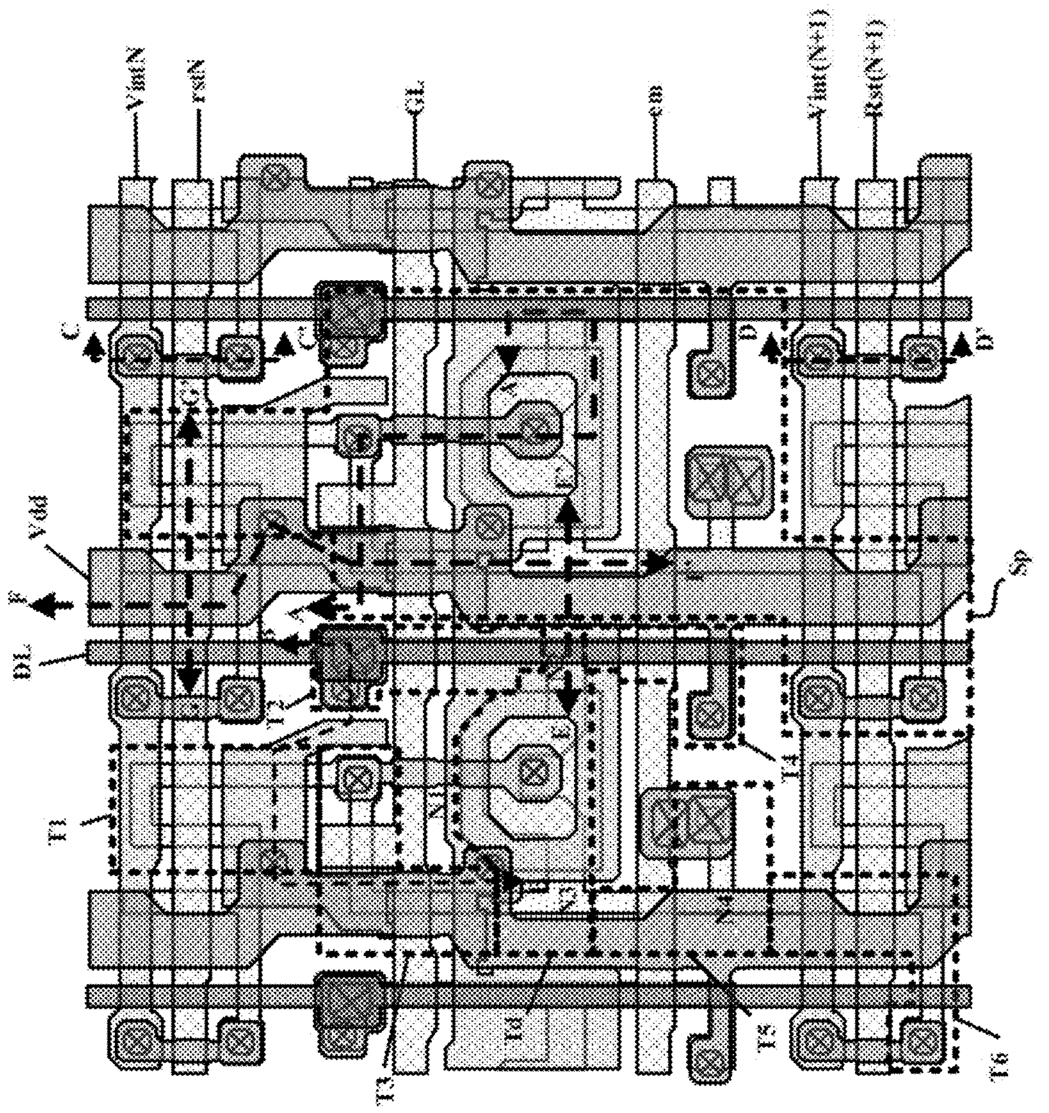
FIG. 3A is a diagram illustrating the structure of a plurality of subpixels of an array substrate in some embodiments according to the present disclosure.

FIG. 3A is a diagram illustrating the structure of a respective subpixel of an array substrate in some embodiments according to the present disclosure. Referring to FIG. 3A, the array substrate in some embodiments includes a plurality of subpixels (e.g., a red subpixel, a green subpixel, and a blue subpixel). The array substrate in some embodiments includes a plurality of gate lines GL respectively extending along a first direction DR1, a plurality of data lines DL respectively extending along a second direction DR2; and a plurality of voltage supply lines Vdd respectively extending along the second direction DR2. Optionally, the array substrate thither includes a plurality of reset control signal lines (including a reset control signal line of a present stage rstN and a reset control signal line of a next stage rst(N+1)) respectively extending along the first direction DR1; a plurality of reset signal lines (including a reset signal line of a present stage VintN and a reset signal line of a next stage Vinit(N+1)) respectively extending along the first direction DR1; and a plurality of light emitting control signal lines em respectively extending along the first direction DR1. Corresponding positions of the plurality of transistors in a pixel driving circuit are depicted in FIG. 3A. The pixel driving circuit includes the first transistor T1, the second transistor T2, the third transistor T3, the fourth transistor T4, the fifth transistor T5, the sixth transistor T6, the sensing transistor Ts, and the driving transistor Td.

Figure 3B:
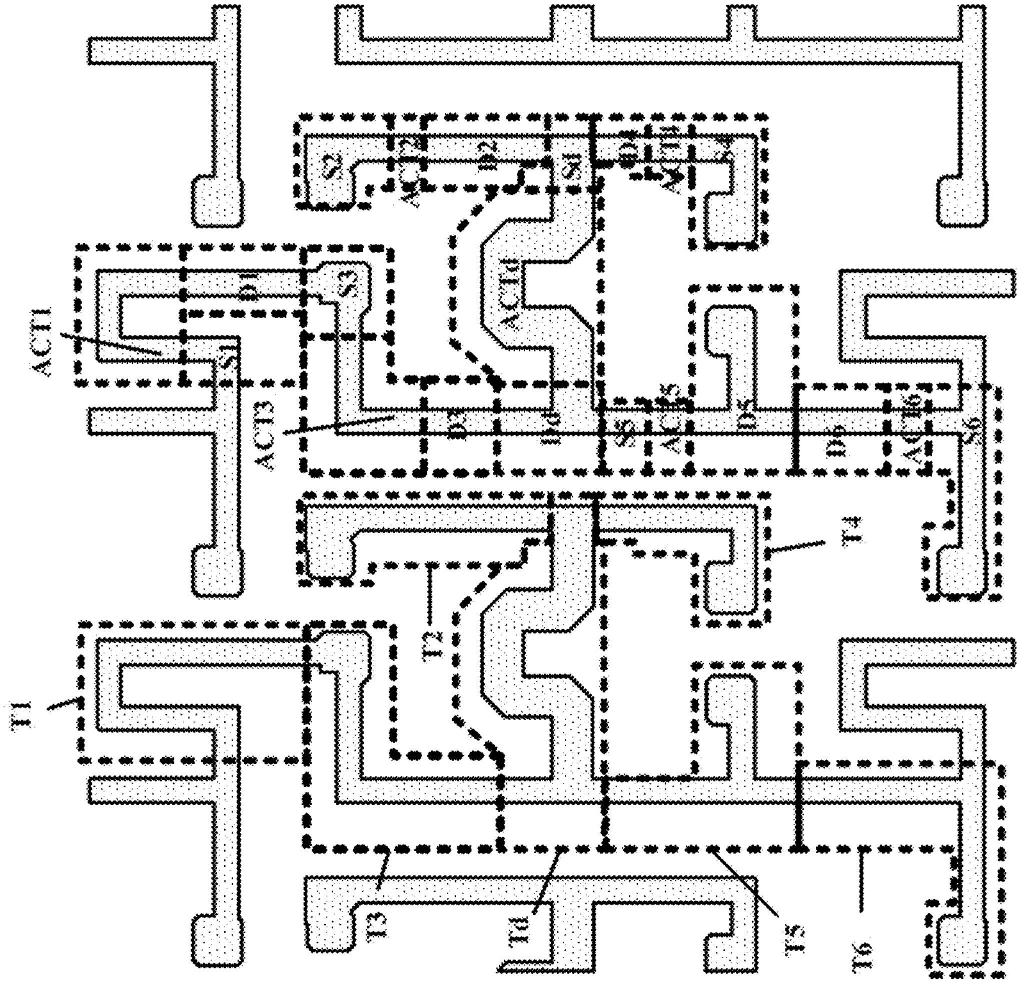
FIG. 3B is a diagram illustrating the structure of a semiconductor material layer in a plurality of subpixels of an array substrate depicted in FIG. 3A.
Figure 3C:
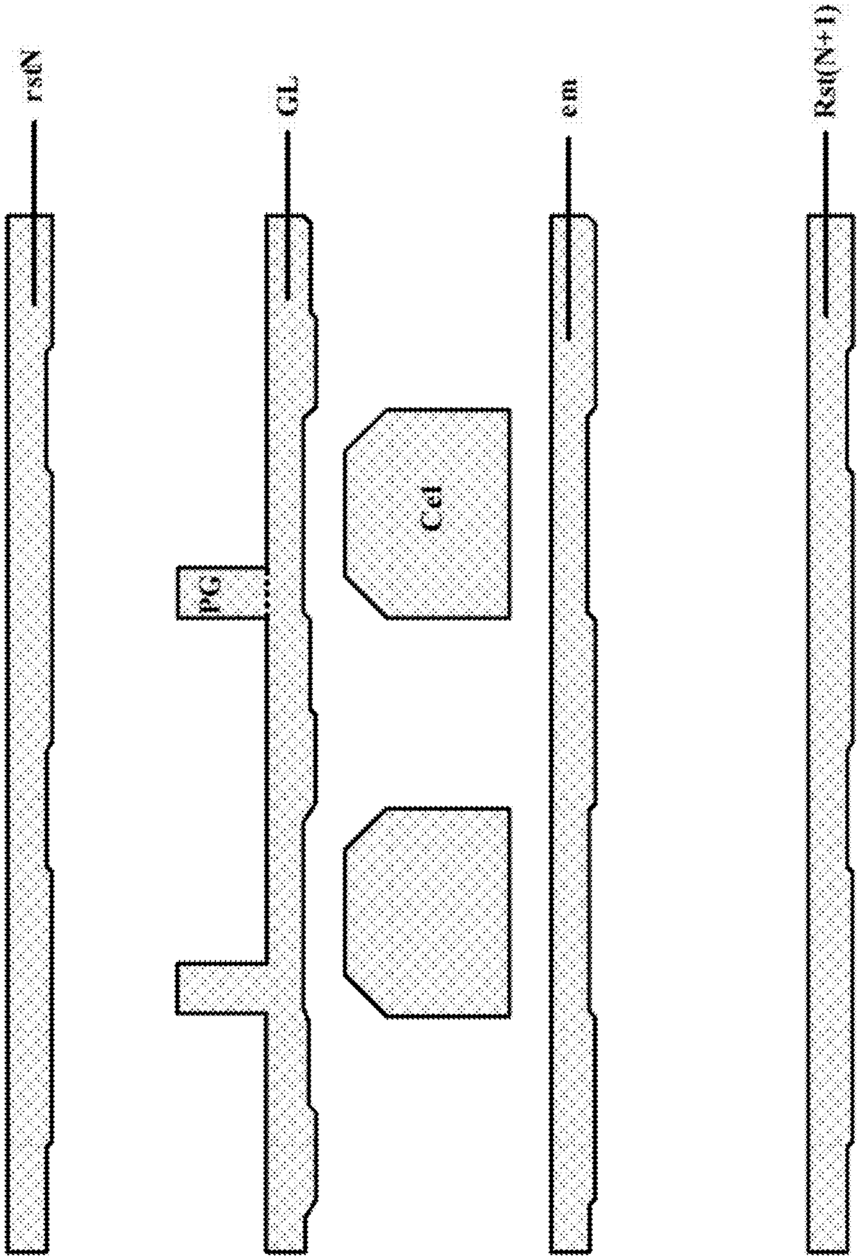
FIG. 3C is a diagram illustrating the structure of a first conductive layer in a plurality of subpixels of an array substrate depicted in FIG. 3A.
Figure 3D:
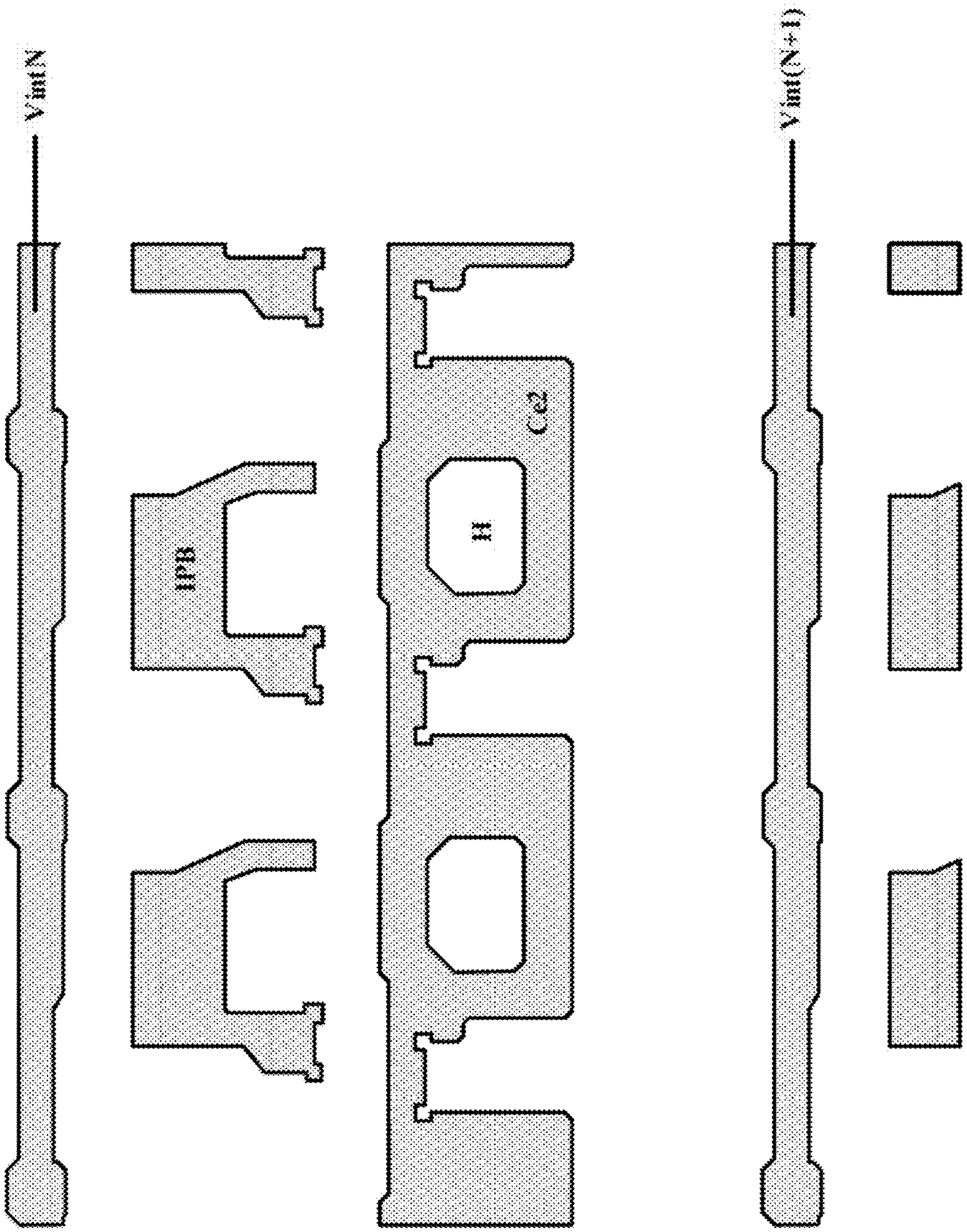
FIG. 3D is a diagram illustrating the structure of a second conductive layer in a plurality of subpixels of an array substrate depicted in FIG. 3A.
Figure 3E:
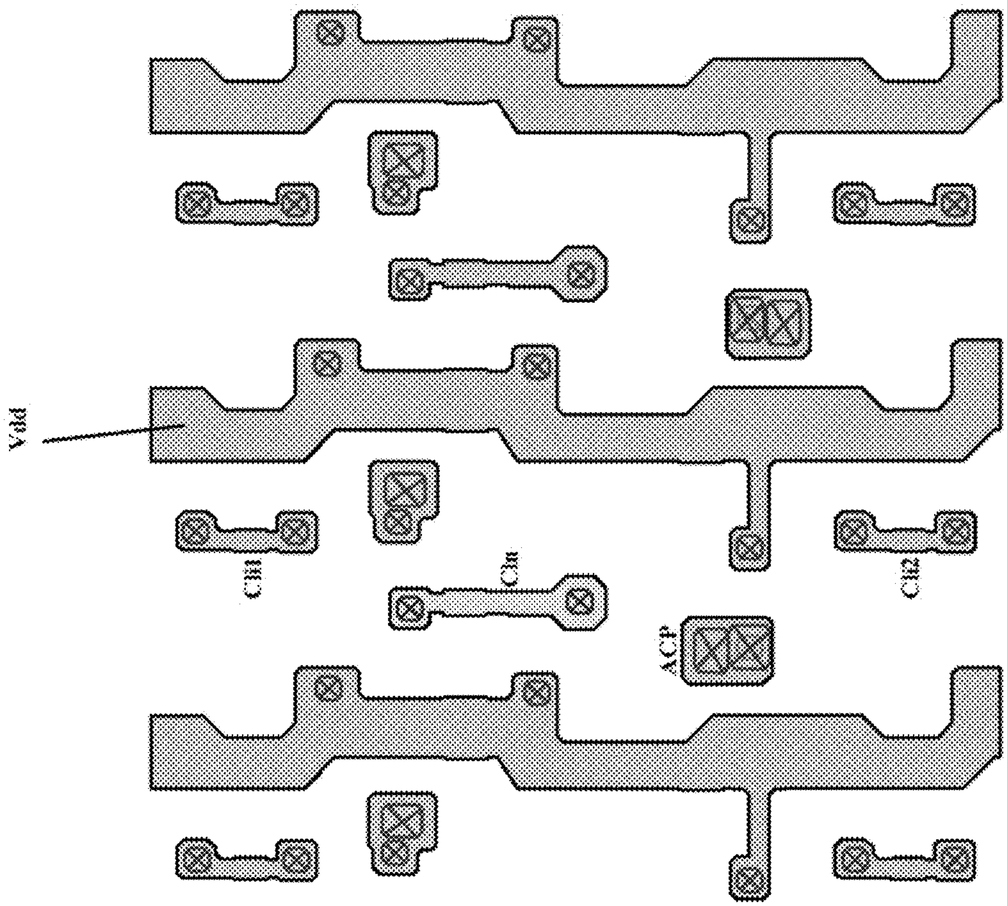
FIG. 3E is a diagram illustrating the structure of a first signal line layer in a plurality of subpixels of an array substrate depicted in FIG. 3A.
Figure 3F:
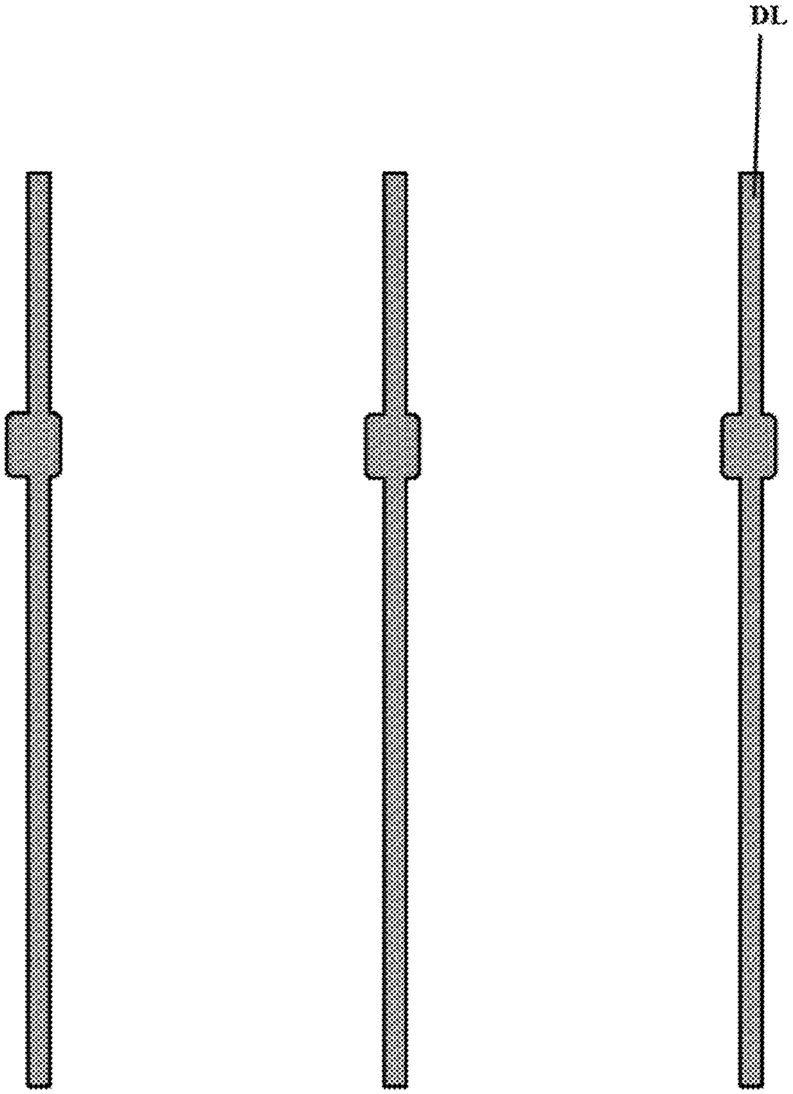
FIG. 3F is a diagram illustrating the structure of a second signal line layer in a plurality of subpixels of an array substrate depicted in FIG. 3A.
Figure 4A:
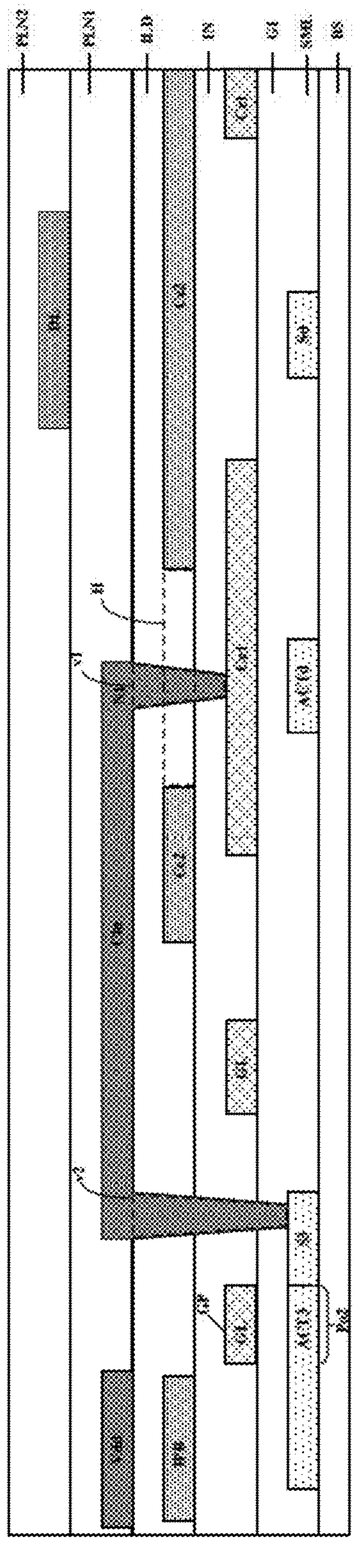
FIG. 4A is a cross-sectional view along an A-A' line in FIG. 3A.
Figure 4B:
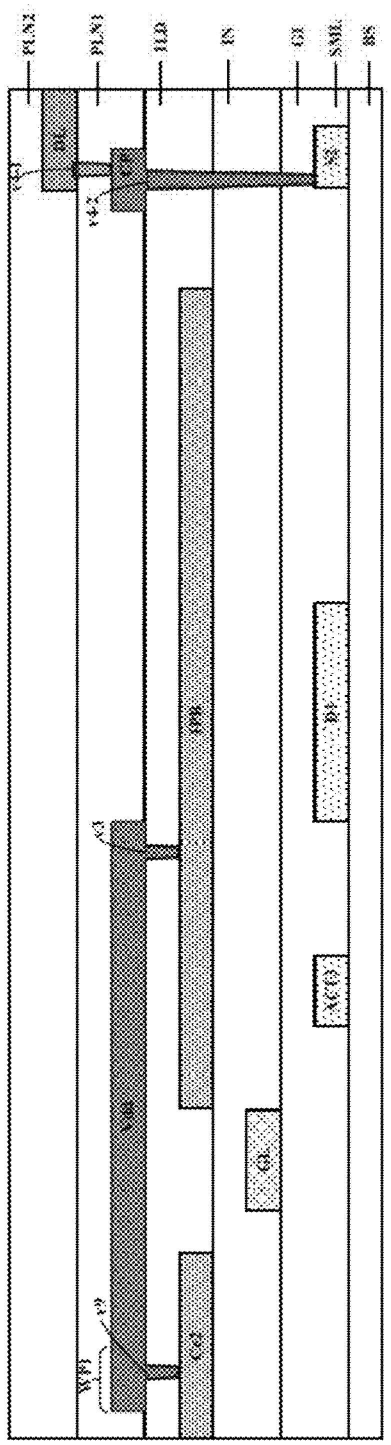
FIG. 4B is a cross-sectional view along a B-B' line in FIG. 3A.

FIG. 3B is a diagram illustrating the structure of a semiconductor material layer in a respective subpixel of an may substrate depicted in FIG. 3A. FIG. 3C is a diagram illustrating the structure of a first conductive layer in a respective subpixel of an array substrate depicted in FIG. 3A. FIG. 3D is a diagram illustrating the structure of a second conductive layer in a respective subpixel of an array substrate depicted in FIG. 3A. FIG. 3E is a diagram illustrating the structure of a first signal line layer in a respective subpixel of an array substrate depicted in FIG. 3A. FIG. 3F is a diagram illustrating the structure of a second signal line layer in a plurality of subpixels of an array substrate depicted in FIG. 3A. FIG. 4A is a cross-sectional view along an A-A' line in FIG. 3A. FIG. 4B is a cross-sectional view along a B-B' line in FIG. 3A. Referring to FIG. 3A to FIG. 3F, and FIG. 4A to FIG. 4B, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GL a second conductive layer on a side of the insulating layer IN away from the first conductive layer, an inter-layer dielectric layer ILD on a side of the second conductive layer away from the insulating layer IN, a first signal line layer on a side of the inter-layer dielectric layer ILD away from the second conductive layer, a first planarization layer PLN1 on a side of the signal line layer away from the inter-layer dielectric layer ILD, a second signal line layer on a side of the first planarization layer PLN1 away from the first signal line layer, and a second planarization layer PLN2 on a side of the second signal line layer away from the first planarization layer PLN1.

Referring to FIG. 2A. FIG. 2B, FIG. 3A, and FIG. 3B, in some embodiments, in a respective subpixel sp, the semiconductor material layer has a unitary structure. In FIG. 3B, the respective subpixel sp is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective subpixel sp is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd a source electrode Sd, and a drain electrode Dd. In one example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in the respective subpixel sp are parts of a unitary structure in the respective subpixel. In another example, the active layers (ACT1, ACT2, ACT3, ACT4, ACT5, ACT6, and ACTd), the source electrodes (S1, S2, S3 S4, S5, S6, Ss, and Sd), and the drain electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2A, FIG. 2B, FIG. 3A, FIG. 3C, FIG. 4A, and FIG. 4B, the first conductive layer in some embodiments includes a plurality of gate lines GL, a plurality of reset control signal lines (including a respective reset control signal line of a present stage rstN and a reset control signal line of a next stage rst(N+1)), a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 2B, FIG. 3A, and FIG. 3D, the second conductive layer in some embodiments includes a plurality of reset signal lines (including a respective reset signal line of a present stage VintN and a reset signal line of a next stage Vinit(N+1)), an interference preventing block IPB and a second capacitor electrode Ce2 of the storage capacitor Cst. The interference preventing block IPB can effectively reduce the cross-talk, particularly vertical cross-talk between the N1 node of the adjacent data lines. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of reset signal lines, the second capacitor electrode Ce2, and the interference preventing block IPB are in a same layer.

Referring to FIG. 2A, FIG. 2B, FIG. 3A, FIG. 3B, and FIG. 3E, the first signal line layer in some embodiments includes a plurality of voltage supply lines Vdd, a node connecting line Cln, a first initialization connecting line Cli1, a second initialization connecting line Cli2, and an anode contact pad ACP. The node connecting line Cln connects the first capacitor electrode Ce1 and the source electrode of the third transistor T3 in a respective subpixel sp together. The first initialization connecting line Cli1 connects a respective reset signal line of the plurality of reset signal lines (e.g., the reset signal line of the present stage VintN) and the source electrode S1 of the first transistor T1 in the respective subpixel sp together. The second initialization connecting line Cli2 connects a respective reset signal line of the plurality of reset signal lines (e.g., the reset signal line of the next stage Vinit(N+1)) and the source electrode S6 of the sixth transistor T6 in the respective subpixel sp together. The anode contact pad ACP connects a source electrode S5 of the fifth transistor T5 in the respective subpixel sp to an anode in the respective subpixel sp. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd the node connecting line cln, the first initialization connecting line Cli1, the second initialization connecting line Cli2 and the anode contact pad ACP are in a same layer.

Referring to FIG. 2A. FIG. 2B, FIG. 3A, FIG. 3B, and FIG. 3F, the second signal line layer in some embodiments includes a plurality of data line DL. Optionally, the second signal line layer further includes an anode contact pad ACP in a respective subpixel of the plurality of subpixels sp. The anode contact pad ACP is electrically connected to a source electrode of the fifth transistor T5 in the respective subpixel of the plurality of subpixels sp through a relay electrode in the respective subpixel of the plurality of subpixels sp. Referring to Referring to FIG. 2A. FIG. 3A, FIG. 3F, FIG. 3G, and FIG. 4B, in some embodiments, a respective data line of the plurality of data lines DL is connected to a connecting portion CP through a via v4-1 extending through the first planarization layer PLN−1, and the connecting portion CP is connected to a source electrode S2 of the second transistor through a via v4-2 extending through the inter-layer dielectric layer ILD, the insulating layer IN, and the gate insulating layer GI.

Referring to FIG. 2A, FIG. 3A, FIG. 3D, FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric: layer ILD and the insulating layer IN. The second via v2 extends through the inter-layer dielectric layer ILD, the insulating layer LN, and the gate insulating layer GI. Optionally, the node connecting line Cln is connected to the first capacitor electrode Ce1 through the first via v1, and is connected node connecting line Cln is connected the semiconductor material layer SML through the second via v2. Optionally, the node connecting line Cln is connected to the source electrode S3 of third transistor, as depicted in FIG. 4A.

Retelling to Retelling to FIG. 2A, FIG. 3A, FIG. 3E, and FIG. 4B, in some embodiments, the interference preventing block IPB is in a same layer as the second capacitor electrode Ce2. The respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS. Optionally, the orthographic projection of the interference preventing block IPB on the base substrate BS at least partially overlaps with an orthographic projection of a drain electrode D1 of the first transistor T1 on the base substrate BS. Moreover, the respective voltage supply line of the plurality of voltage supply lines Vdd is connected to the second capacitor electrode Ce2 through a ninth via v9. Optionally, the ninth via v9 extends through the inter-layer dielectric layer ILD. Optionally, an orthographic projection of the second capacitor electrode Ce2 on the base substrate BS partially overlaps with an orthographic projection of the respective voltage supply line of the plurality of voltage supply lines Vdd on the base substrate BS.

Referring to Referring to FIG. 2A, FIG. 3A. FIG. 3E, and FIG. 4B, in some embodiments, a respective data line of the plurality of data lines DL is connected to a connecting portion CP through a via v4-1 extending through the first planarization layer PLN−1, and the connecting portion CP is connected to a source electrode S2 of the second transistor through a via v4-2 extending through the inter-layer dielectric layer ILD, the insulating layer IN, and the gate insulating layer GI.

Figure 4C:
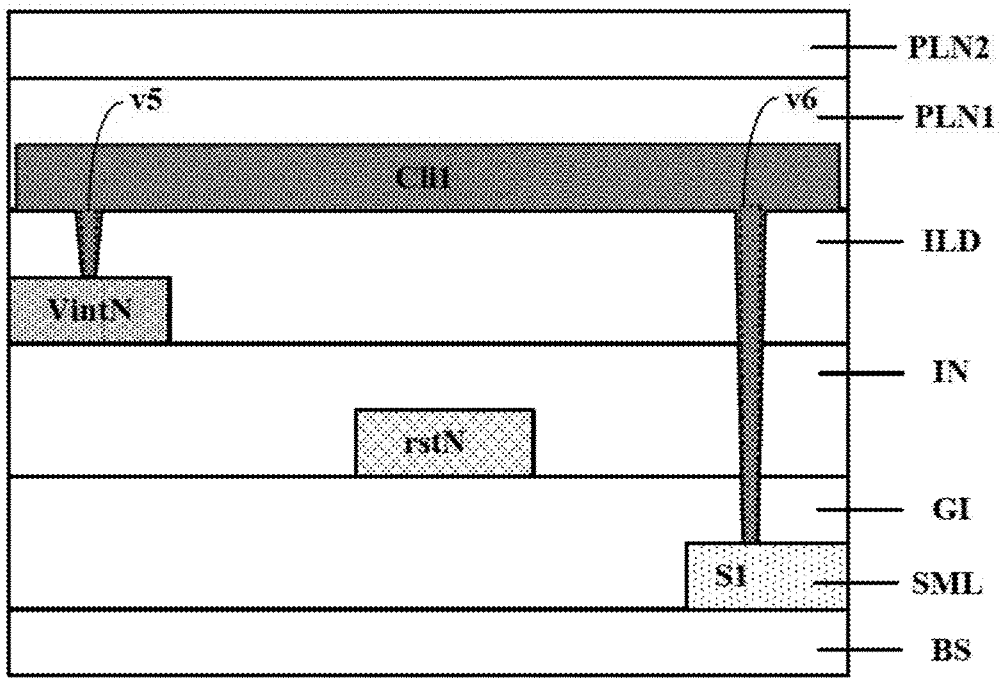
FIG. 4C is a cross-sectional view along a C-C' line in FIG. 3A.

FIG. 4C is a cross-sectional view along a C-C' line in FIG. 3A. Referring to FIG. 2A, FIG. 2B, FIG. 3A, FIG. 3B, FIG. 3E, and FIG. 4C, in some embodiments, the first initialization connecting line Cli1 connects a respective reset signal line of the plurality of reset signal lines (e.g., the reset signal line of the present stage VintN) and the source electrode S1 of the first transistor T1 in the respective subpixel sp together. The respective reset signal line of the plurality of reset signal lines (e.g., the reset signal line of the present stage VintN) is configured to provide a reset signal to the source electrode S1 of the first transistor T1 in the respective subpixel, through the first initialization connecting line Cli1. Optionally, the first initialization connecting line Cli1 is connected to the reset signal line of the present stage VintN through a fifth main via v5 extending through the inter-layer dielectric layer ILD. Optionally, the first initialization connecting line Cli1 is connected to the source electrode S1 of the first transistor T1 in the respective subpixel through a sixth main via v6 extending through the inter-layer dielectric layer ILD, the insulating layer IN, and the gate insulating layer GI.

Figure 4D:
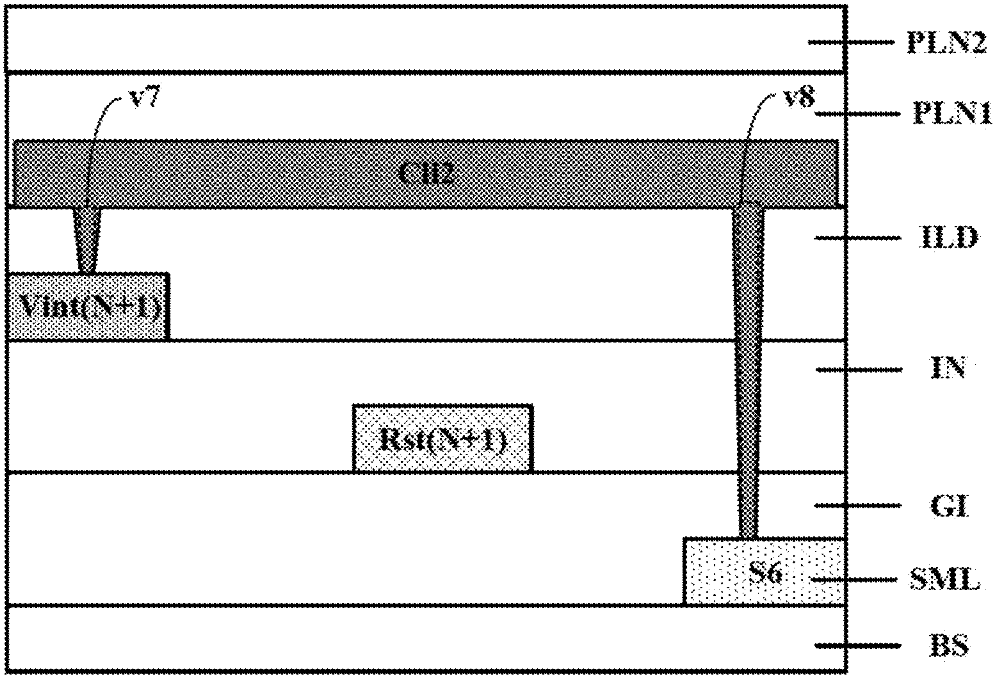
FIG. 4D is a cross-sectional view along a D-D' line in FIG. 3A.

FIG. 4D is a cross-sectional view along a D-D' line in FIG. 3A. Referring to FIG. 2A, FIG. 2B, FIG. 3A, FIG. 3B, FIG. 3E, and FIG. 4D, in some embodiments, the second initialization connecting line Cli2 connects a respective reset signal line of the plurality of reset signal lines (e.g., the reset signal line of the next stage Vinit(N+1)) and the source electrode S6 of the sixth transistor T6 in the respective subpixel sp together. The respective reset signal line of the plurality of reset signal lines (e.g., the reset signal line of the next stage Vinit(N+1)) is configured to provide a reset signal to the source electrode S6 of the sixth transistor T6 in the respective subpixel, through the second initialization connecting line Cli2. Optionally, the second initialization connecting line Cli2 is connected to the reset signal line of the next stage Vinit(N+1) through a seventh main via v7 extending through the inter-layer dielectric layer ILD. Optionally, the second initialization connecting line Cli2 is connected to the source electrode S6 of the sixth transistor T6 in the respective subpixel through an eighth main via v8 extending through the inter-layer dielectric layer ILD, the insulating layer EN, and the gate insulating layer GI.

Figure 5A:
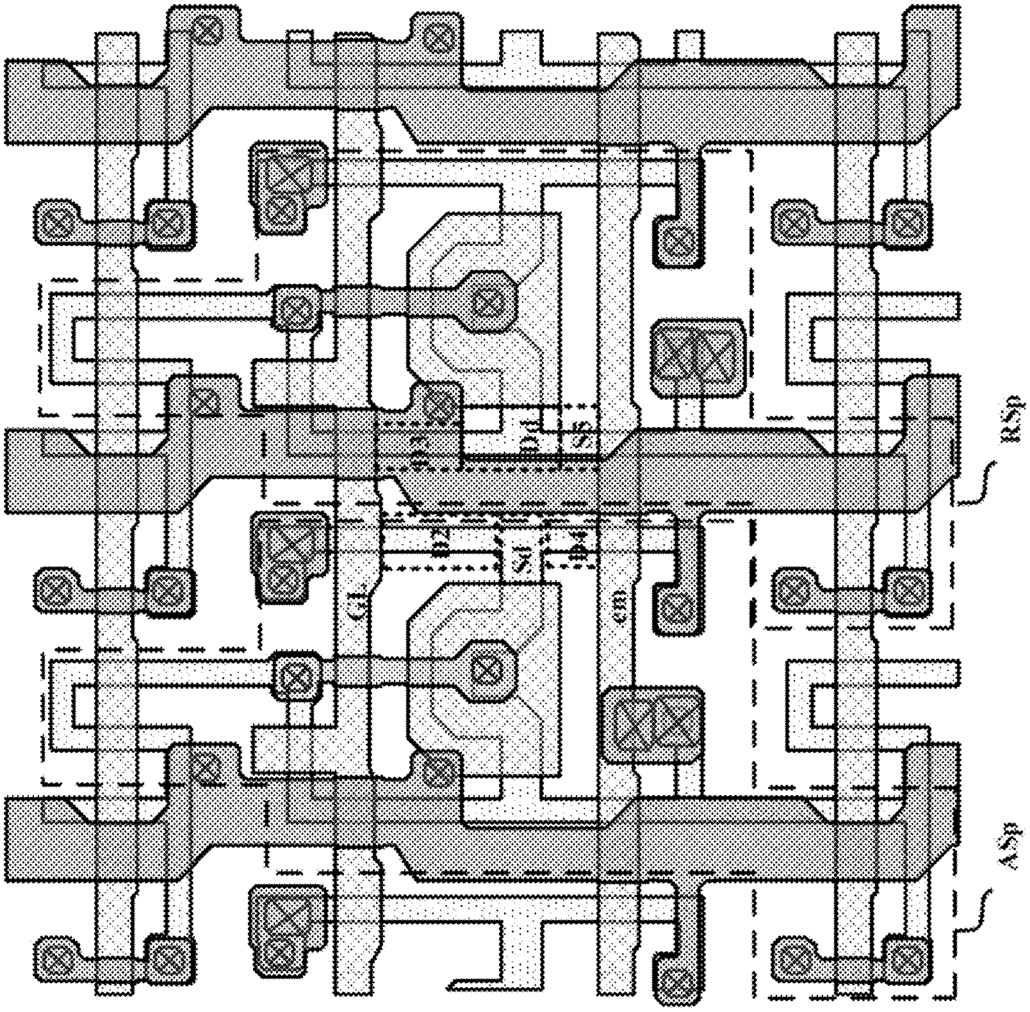
FIG. 5A is a diagram illustrating a semiconductor material layer, a first conductive layer, and a first signal line layer in an array substrate in some embodiments according to the present disclosure.
Figure 5B:
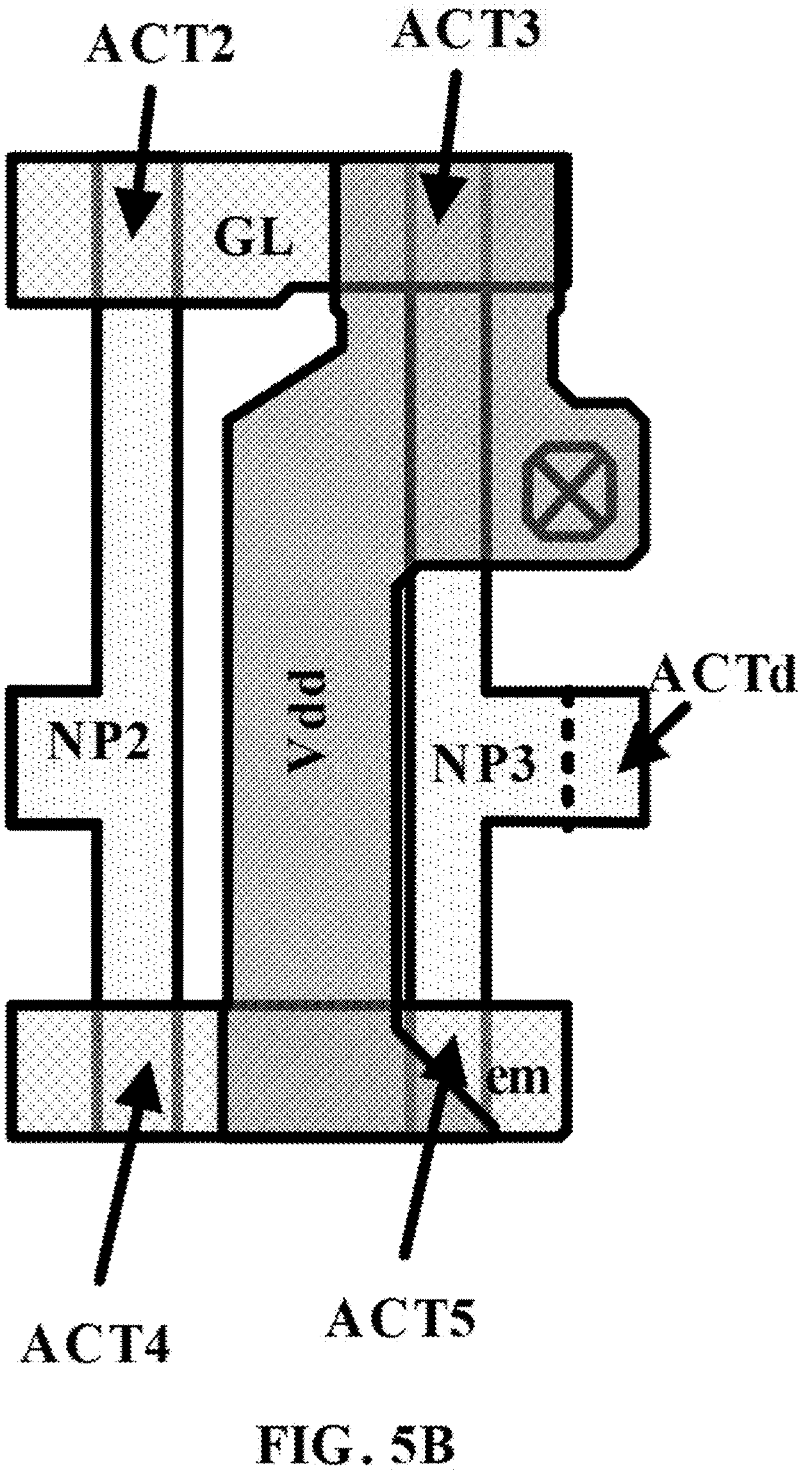
FIG. 5B is a zoom-in view of a region around a third node in FIG. 5A.

FIG. 5A is a diagram illustrating a semiconductor material layer, a first conductive layer, and a first signal line layer in an array substrate in some embodiments according to the present disclosure. FIG. 5B is a zoom-in view of a region around a third node in FIG. 5A. Referring to FIG. 3A, FIG. 3B, FIG. 4A. FIG. 4B, FIG. 5A, and FIG. 5B, in some embodiments, the array substrate includes a base substrate BS; a semiconductor material layer SML on the base substrate; and a plurality of voltage supply lines Vdd on a side of the semiconductor material layer SML away from the base substrate BS. Optionally, in a respective subpixel sp, the semiconductor material layer SML includes an active layer ACT3 of a third transistor T3, an active layer ACT5 of a fifth transistor T5, an active layer ACTd of a driving transistor Td, a third node portion NP3 that is connected to the active layer ACT3 of the third transistor T3, the active layer ACT5 of the fifth transistor T5, and the active layer ACTd of the driving transistor Td in the respective subpixel sp. Referring to FIG. 2A, FIG. 2B, FIG. 3A, FIG. 5A, and FIG. 5B, the third node portion NP3 is a portion of the semiconductor material layer having the third node N3.

In one example, boundaries of the third node portion NP3 are defined by respective boundaries of adjacent active layers. In another example, boundaries of adjacent active layers are in turn defined by orthographic projections of respective gate electrodes on the semiconductor material layer SML. For example, boundaries of the active layer ACT3 of the third transistor T3 are defined by an orthographic projection the respective gate line on the semiconductor material layer SML; boundaries of the active layer ACT5 of the fifth transistor T5 are defined by an orthographic projection the respective light emitting control signal line on the semiconductor material layer SML; and boundaries of the active layer ACTd of the driving transistor Td are defined by an orthographic projection the first capacitor electrode Ce1 (functioning as a gate electrode of the driving transistor Td) on the semiconductor material layer SML. Accordingly, in some embodiments, the boundaries of the third node portion NP3 are defined an adjacent boundary of the active layer ACT3 of the third transistor T3, an adjacent boundary of the active layer ACT5 of the fifth transistor T5, and an adjacent boundary of the active layer ACTd of the driving transistor Td.

The inventors of the present disclosure discover that, a parasitic capacitance between the respective voltage supply line and the third node N3 can unnecessarily increase the minimum charging time for charging the driving transistor T3 (e.g., by charging the N1 node). The inventors of the present disclosure discover that, surprisingly and unexpectedly, minimizing the parasitic capacitance between the respective voltage supply line and the third node N3 can decrease the minimum charging time for charging the driving transistor T3, achieving faster response and enhancing image display quality.

Accordingly, the respective voltage signal line in the present disclosure is one having non-uniform line width. For example, a portion of the respective voltage signal line around the third node N3 has a line width smaller than those of the portions immediately adjacent to the portion around the third node N3. The intricate structure of the respective voltage signal line in the present disclosure reduces overlapping between the respective voltage signal line and the third node portion NP3, thereby reducing the parasitic capacitance between the respective voltage supply line and the third node N3.

In some embodiments, at least 30% (e.g., at least 35%, at least 40%, at least 45%, at least 50%, at least 55%, at least 60%, at least 65%, at least 70%, at least 75%, at least 80%, at least 85%, at least 90%, at least 95%, or at least 99%) of an orthographic projection of the third node portion on the base substrate is non-overlapping with an orthographic projection of a respective voltage supply line on the base substrate. Optionally, at least 50% of the orthographic projection of the third node portion on the base substrate is non-overlapping with the orthographic projection of the respective voltage supply line on the base substrate.

Figure 4E:
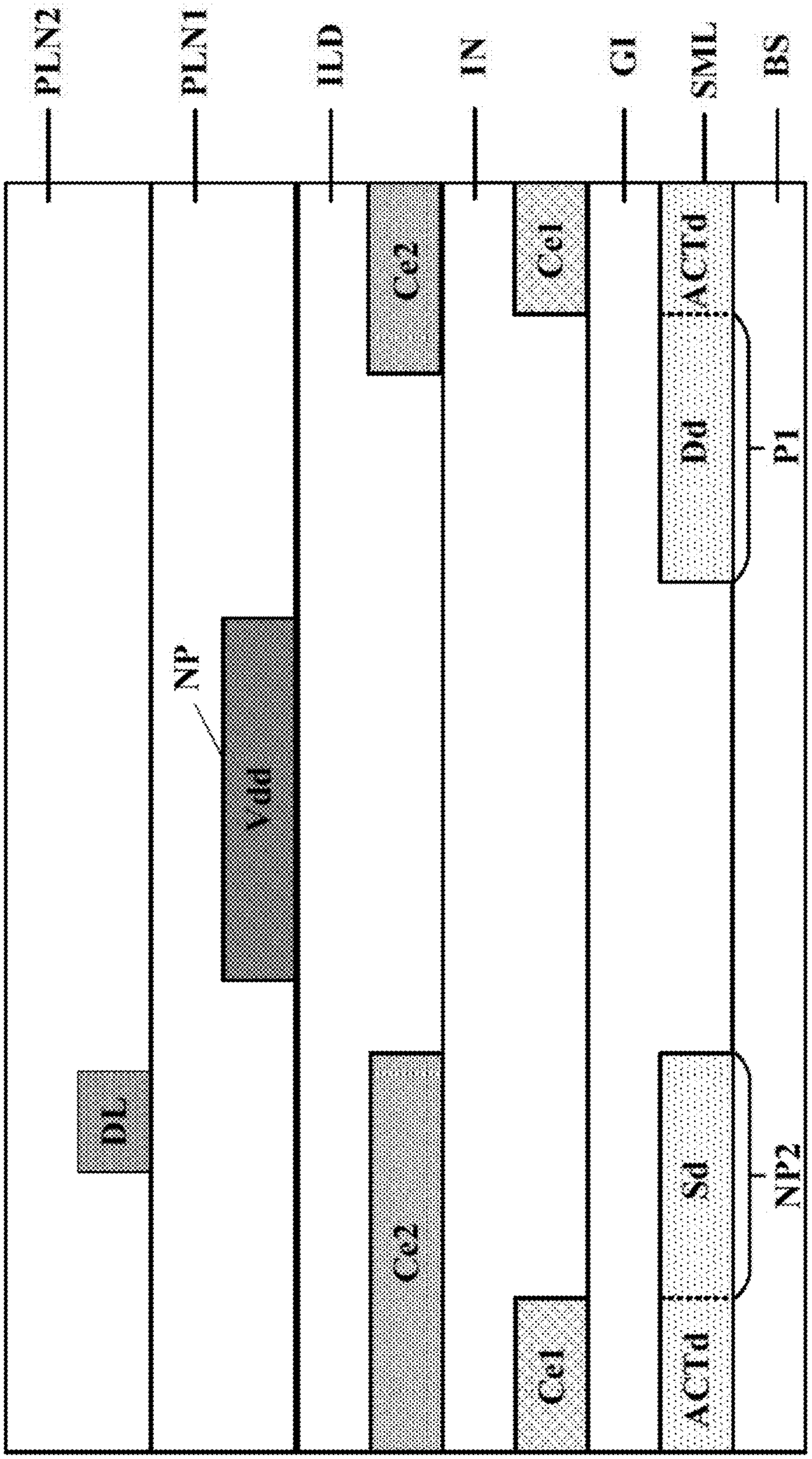
FIG. 4E is a cross-sectional view along an E-E' line in FIG. 3A.
Figure 4F:
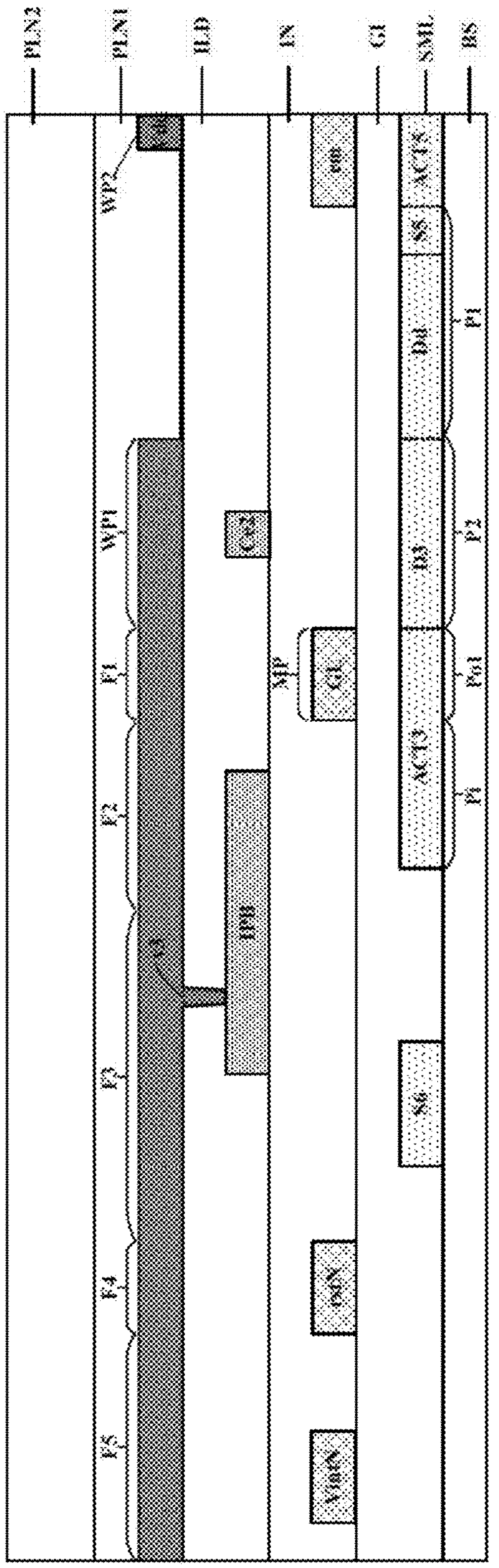
FIG. 4F is a cross-sectional view along an F-F' line in FIG. 3A.

FIG. 4E is a cross-sectional view along an E-E' line in FIG. 3A. FIG. 4F is a cross-sectional view along an F-F' line in FIG. 3A. Referring to FIG. 4E and FIG. 5A, along a row direction (e.g., perpendicular to the extending direction of the respective voltage supply line), the orthographic projection of at least a portion of the respective voltage supply line on the base substrate BS is non-overlapping with the orthographic projection of at least a portion of the semiconductor material layer SMT on the base substrate BS, and the orthographic projection of at least a portion of the respective voltage supply line is between a source electrode Sd of a driving transistor Td in an adjacent subpixel Asp immediately adjacent to a respective subpixel RSp and a drain electrode Dd of a driving transistor Td in the respective subpixel RSp. Along a column direction (e.g., parallel to the extending direction of the respective voltage supply line), the orthographic projection of the respective Voltage supply line on the base substrate BS is at least partially non-overlapping with the orthographic projection of the semiconductor material layer SML on the base substrate BS. In one example, along the column direction, the orthographic projection of the respective voltage supply line on the base substrate BS is at least partially non-overlapping with an orthographic projection of the drain electrode Dd of a driving transistor Id in the respective subpixel RSp on the base substrate BS and is at least partially non-overlapping with an orthographic projection of a source electrode S5 of the fifth transistor T5 in the respective subpixel RSp on the base substrate BS.

Figure 5C:
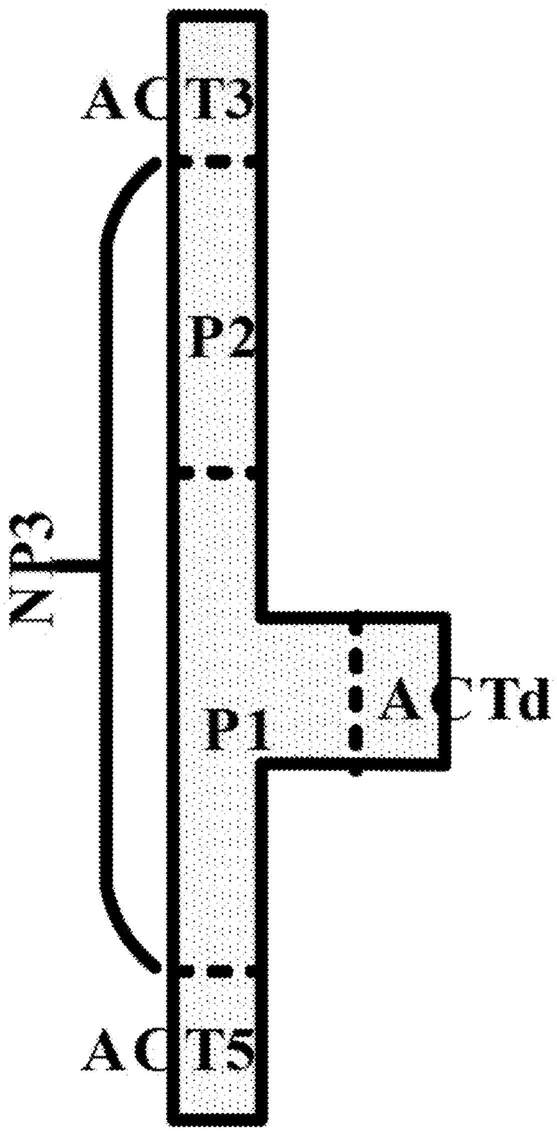
FIG. 5C is a diagram illustrating a partial structure of a semiconductor material layer in a respective subpixel in FIG. 5B.

FIG. 5C is a diagram illustrating a partial structure of a semiconductor material layer in a respective subpixel in FIG. 5B. Referring to FIG. 3A, FIG. 5A, FIG. 5B, and FIG. 5C, the third node portion NP3 in some embodiments includes contiguously a first portion P1 and a second portion P2. The first portion P1 is connected to the active layer ACT5 of the fifth transistor T5, the active layer ACTd of the driving transistor Td, and the second portion P2. The second portion P2 connects the first portion P1 to the active layer ACT3 of the third transistor T3. Referring to FIG. 3A, FIG. 5A, FIG. 5B, FIG. 5C, and FIG. 4F, in some embodiments, an orthographic projection of the first portion P1 is non-overlapping with the orthographic projection of the respective voltage supply line on the base substrate BS, wherein an orthographic projection of the second portion P2 is at least partially overlapping with the orthographic projection of the respective voltage supply line on the base substrate BS. An orthographic projection of the active layer ACT3 of the third transistor T3 on the base substrate BS overlaps with an orthographic projection of a respective gate line of the plurality of gate lines GL on the base substrate BS. An orthographic projection of the active layer ACT5 of the fifth transistor T5 on the base substrate BS overlaps with an orthographic projection of a respective light emitting control signal line of the plurality of light emitting control signal lines em on the base substrate BS.

Optionally, the first portion P1 includes at least a portion of a drain electrode Dd of the driving transistor Td in the respective subpixel RSp. Optionally, the first portion P1 includes at least a portion of a source electrode S5 of the fifth transistor T5 in the respective subpixel RSp. Optionally, the second portion P2 includes at least a portion of a drain electrode D3 of the third transistor T3 in the respective subpixel RSp.

Figure 5D:
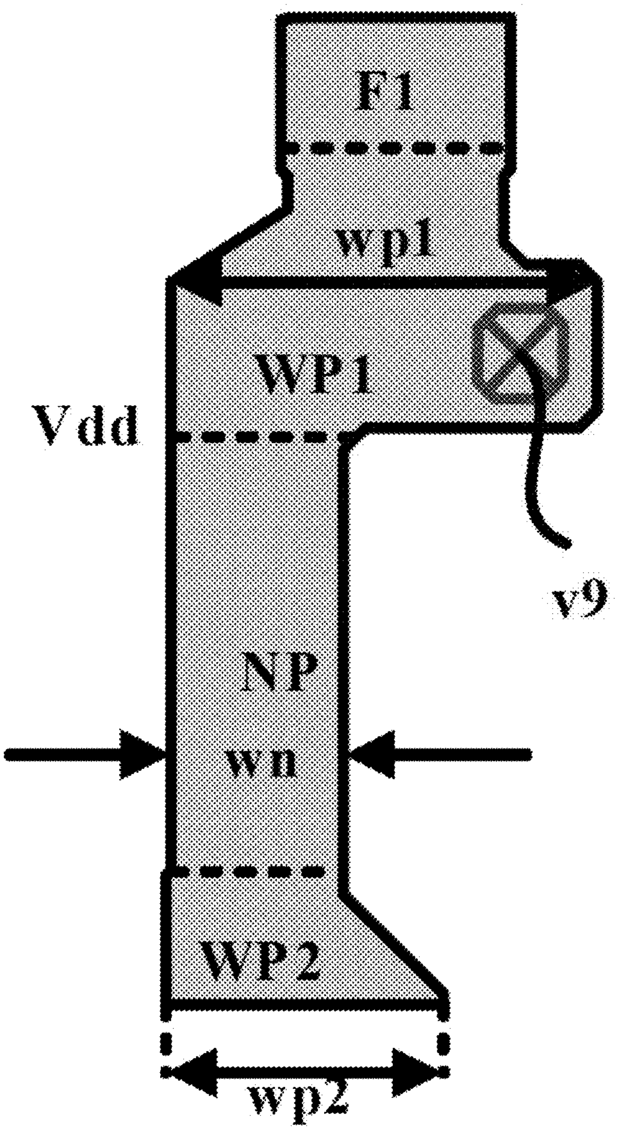
FIG. 5D is a diagram illustrating a partial structure of a respective voltage supply line in FIG. 5B.

FIG. 5D is a diagram illustrating a partial structure of a respective voltage supply line in FIG. 5B. Referring to FIG. 3A, FIG. 5A, FIG. 5B, and FIG. 5D, in the respective subpixel RSp, the respective voltage supply line of the plurality of voltage supply lines Vdd in some embodiments includes contiguously a first wide portion WP1, a narrow portion NP, and a second wide portion WP2. The narrow portion NP connects the first wide portion WP1 and the second wide portion WP2 together.

Referring to FIG. 3A, FIG. 5A, FIG. 5B, FIG. 5D, FIG. 4E, and FIG. 4F, in some embodiments, an orthographic projection of the first wide portion WP1 on the base substrate BS is at least partially overlapping with an orthographic projection of the second portion P2 on the base substrate BS. Optionally, the orthographic projection of the first wide portion WP1 on the base substrate BS covers an orthographic projection of the second portion P2 on the base substrate BS. In some embodiments, an orthographic projection of the narrow portion NP on the base substrate BS is non-overlapping with an orthographic projection of the semiconductor material layer SML on the base substrate BS. In some embodiments, an orthographic projection of the second wide portion WP2 on the base substrate BS is at least partially overlapping with an orthographic projection of the active layer ACT5 of the fifth transistor T5 on the base substrate BS and an orthographic projection of a respective light emitting control signal line of the plurality of light emitting control signal lines em on the base substrate BS.

In some embodiments, the first wide portion WP1 has an average line width wp1; the narrow portion NP has an average line width wn; and the second wide portion WP2 has an average line width wp2. Optionally, the average line width wn is smaller than the average line width wp1, and is smaller than the average line width wp2.

Referring to FIG. 3A, FIG. 5A, FIG. 5B, FIG. 5D, and FIG. 4B, in some embodiments, the first wide portion WP1 is a portion of the respective voltage supply line that connects to the second capacitor electrode Ce2 of a storage capacitor through a ninth via v9 extending through the inter-layer dielectric layer ILD.

Referring to FIG. 3A, FIG. 5A, FIG. 5B, FIG. 5D, FIG. 4E, and FIG. 4F, in some embodiments, in the respective subpixel RSp, the respective voltage supply line of the plurality of voltage supply lines Vdd in some embodiments includes contiguously a first segment F1, a first wide portion WP1, a narrow portion NP, and a second wide portion WP2. The narrow portion NP connects the first wide portion WP1 and the second wide portion WP2 together. The first wide portion WP1 connects the first segment F1 and the narrow portion NP together. An orthographic projection of the first segment F1 on the base substrate BS is at least partially overlapping with an orthographic projection of the active layer ACT3 of the thud transistor T3 in the respective subpixel RSp on the base substrate BS and an orthographic projection of a respective gate line of the plurality of gate lines GL on the base substrate BS. An orthographic projection of a boundary between the first segment F1 and the first wide portion WP1 on the base substrate BS overlaps with an orthographic projection of a boundary between the active layer ACT3 of the third transistor T3 and the second portion P2 on the base substrate BS.

Figure 5E:
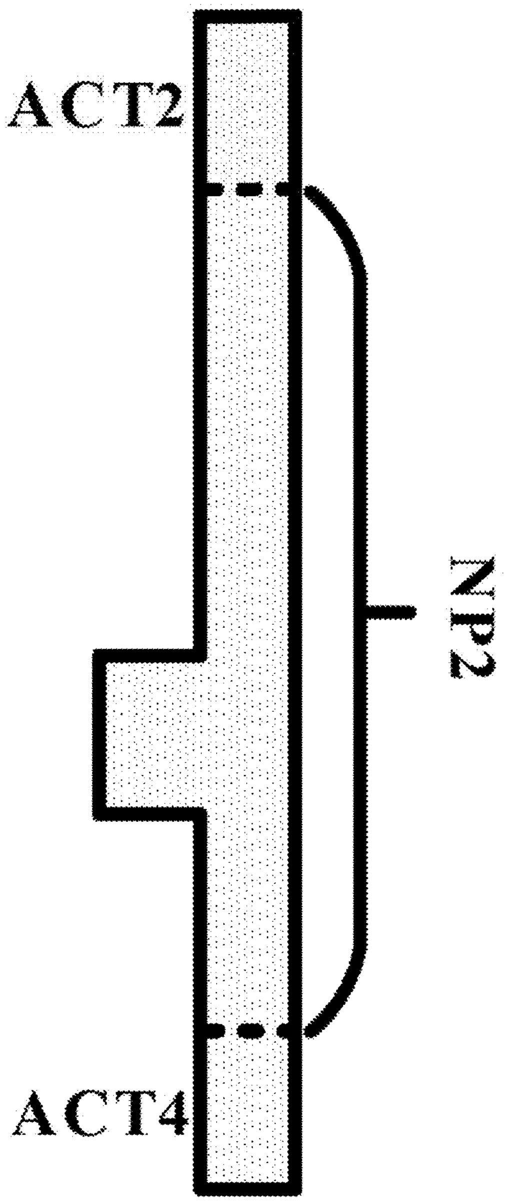
FIG. 5E is a diagram illustrating a partial structure of a semiconductor material layer in an adjacent subpixel in FIG. 5B.

FIG. 5A depicts a respective subpixel RSp and an adjacent subpixel Asp immediately adjacent to the respective subpixel RSp. In one example, the respective subpixel RSp and the adjacent subpixel Asp are two immediately adjacent subpixels along the row direction (e.g., parallel to an extending direction of the respective gate line). FIG. 5E is a diagram illustrating a partial structure of a semiconductor material layer in an adjacent subpixel in FIG. 5B. Referring to FIG. 3A, FIG. 5A, FIG. 5B, FIG. 5D, FIG. 5E, and FIG. 4E, in the adjacent subpixel ASp immediately adjacent to the respective subpixel RSp, the semiconductor material layer SML includes an active layer ACT2 of a second transistor T2, an active layer ACT4 it a fourth transistor T4, an active layer ACTd of a driving transistor Td, and a second node portion NP2. The second node portion NP2 is connected to the active layer ACT2 of the second transistor T2, the active layer ACT4 of the fourth transistor T4, and the active layer ACTd of the driving transistor Td in the adjacent subpixel ASp. Referring to FIG. 2A, FIG. 2B, FIG. 3A, FIG. 5A, FIG. 5B, and FIG. 5E, the second node portion NP2 is a portion of the semiconductor material layer having the second node N2. In some embodiments, at least 80% (e.g., at least 85%, at least 90%, at least 95%, at least 99%, or 100%) of an orthographic projection of the second node portion NP2 on the base substrate BS is non-overlapping with the orthographic projection of the respective voltage supply line on the base substrate BS. Referring to FIG. 4E, in one example, an orthographic projection of the second node portion NP2 on the base substrate BS is non-overlapping with the orthographic projection of the respective voltage supply line on the base substrate BS.

Referring to FIG. 3A, FIG. 5A to FIG. 5E, FIG. 4E, and FIG. 4F, at least a narrow portion NP of the respective voltage supply line in the respective subpixel RSp is between the second node portion NP2 and the third node portion NP3, more specifically, between the second node portion NP2 and the first portion P1. An orthographic projection of the narrow portion NP on the base substrate BS is non-overlapping with an orthographic projection of the second node portion NP2 on the base substrate BS, and is non-overlapping with an orthographic projection of the third node portion NP3 on the base substrate BS.

The inventors of the present disclosure discover that, overlapping between the plurality of voltage supply lines Vdd and the plurality of gate lines GL increases loading in the plurality of gate lines GL. Reducing the overlapping area between the plurality of voltage supply lines Vdd and the plurality of gate lines GL can effectively reduce loading in the plurality of gate lines GL, achieving faster response and enhancing image display quality.

Figure 6A:
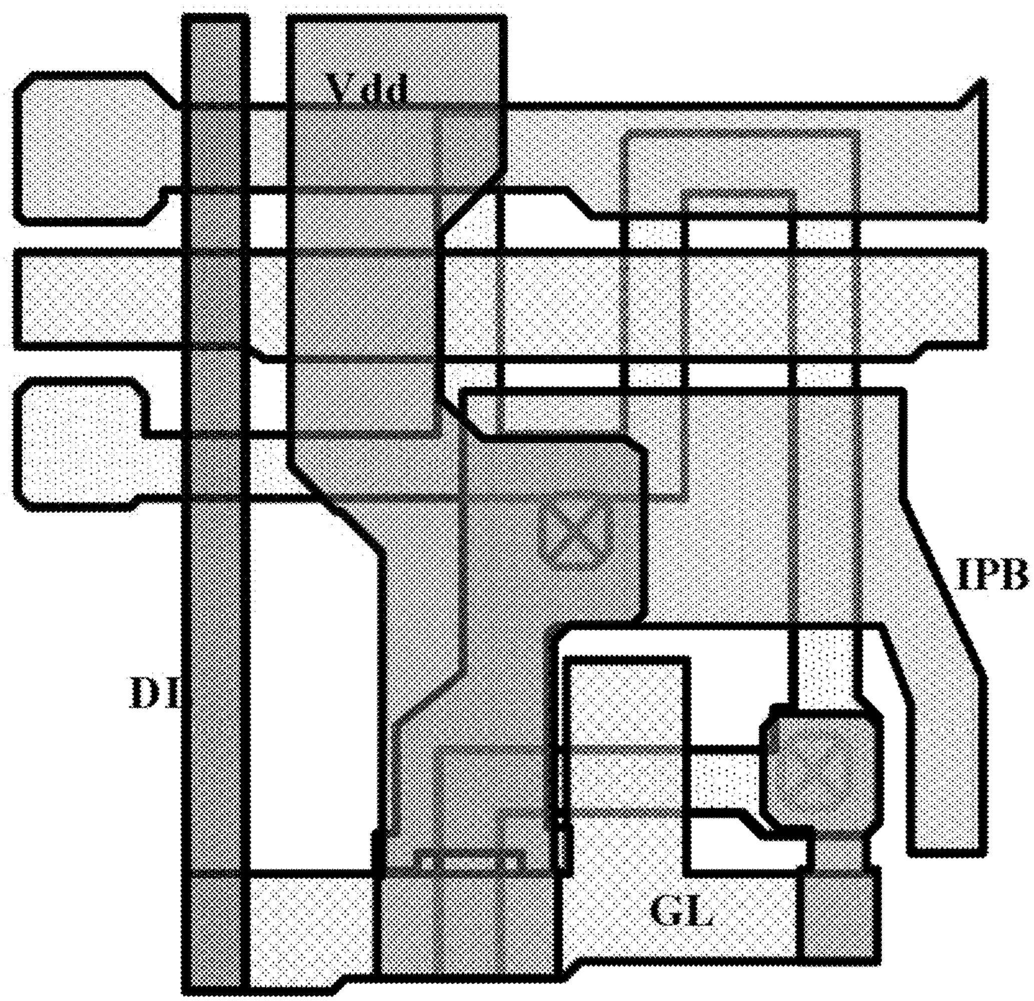
FIG. 6A is a zoom-in view of a region around an interference preventing block in FIG. 3A.
Figure 6B:
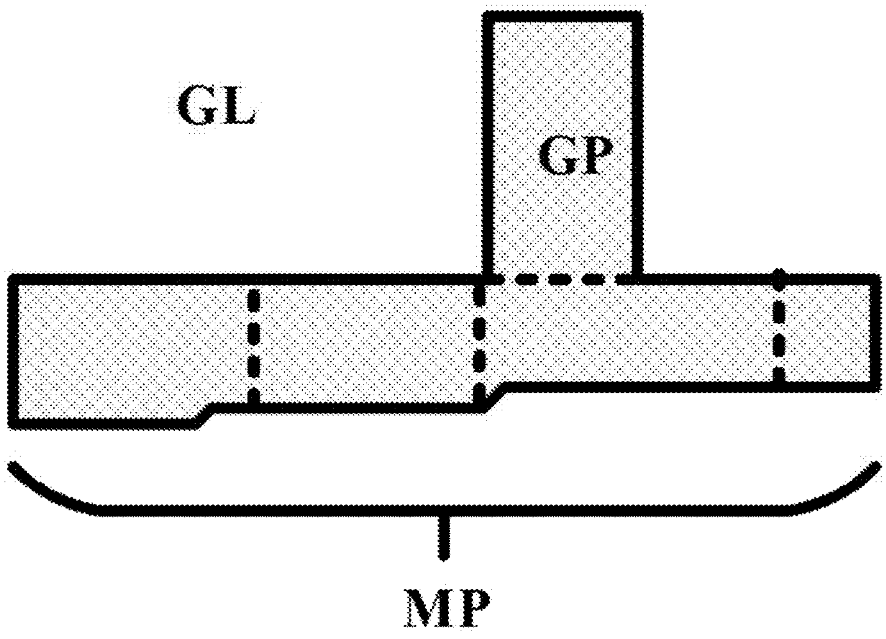
FIG. 6B is a diagram illustrating a partial structure of a respective gate line in FIG. 6A.

Accordingly, the respective voltage signal line in the present disclosure is one having non-uniform line width. FIG. 6A is a zoom-in view of a region around an interference preventing block in FIG. 3A. FIG. 6B is a diagram illustrating a partial structure of a respective gate line in FIG. 6A. Referring to FIG. 3A, FIG. 6A, and FIG. 6B, in the respective subpixel, a respective gate line of the plurality of gate lines GL in some embodiments includes a main portion MP extending along an extension direction of the respective gate line, and a gate protrusion GP protruding away from the main portion MP, e.g., toward the interference preventing block IPB. Optionally, the gate protrusion GP protrudes away from the main portion MP along the column direction, e.g., a direction perpendicular to the extension direction of the respective gate line.

In some embodiments, as discussed above, the third transistor T3 is a double gate transistor. In some embodiments, the gate protrusion GP is one of the double gates m the third transistor T3. In some embodiments, and referring to FIG. 4A, an orthographic projection of the gate protrusion GP on the base substrate BS at least partially overlaps with an orthographic projection of the active layer ACT3 of the third transistor T3 on the base substrate BS. To reducing loading in the plurality of gate lines GL, at least 90% (e.g., at least 95%, at least 98%, at least 99%, or 100%) of the orthographic projection of the gate protrusion GP on the base substrate BS is non-overlapping with an orthographic projection of a respective voltage supply line of the plurality of voltage supply lines Vdd on the base substrate BS. Referring to FIG. 3A, FIG. 6A, FIG. 6B, and FIG. 4A, optionally, the orthographic projection of the gate protrusion GP on the base substrate BS is non-overlapping with the orthographic projection of the respective voltage supply line on the base substrate BS.

Figure 6C:
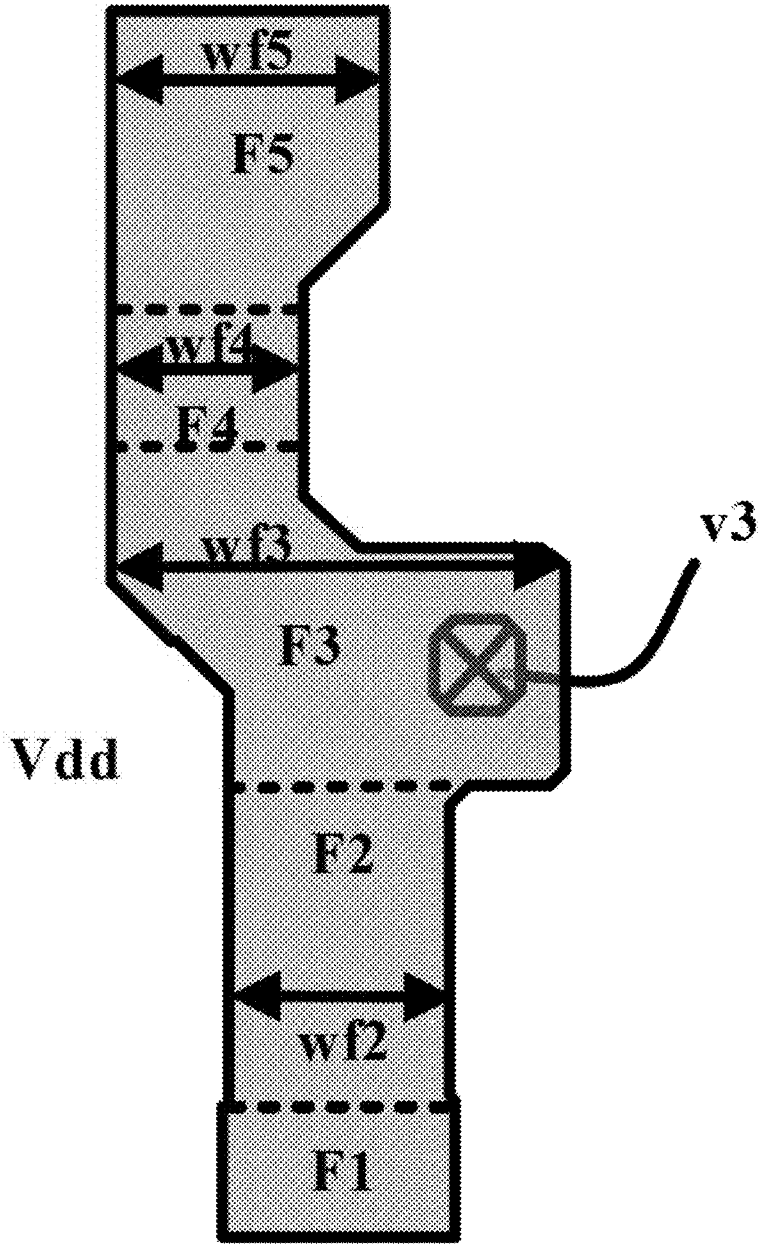
FIG. 6C is a diagram illustrating a partial structure of a respective voltage supply line in FIG. 6A.

FIG. 6C is a diagram illustrating a partial structure of a respective voltage supply line in FIG. 6A. Referring to FIG. 3A, FIG. 6A, FIG. 6B, and FIG. 6C, in some embodiments, in the respective subpixel, the respective voltage supply line of the plurality of voltage supply lines Vdd includes contiguously a first segment F1, a second segment F2, a third segment F3, and a fourth segment F4. The second segment F2 connects the first segment F1 to the third segment F3. The third segment F3 connects the second segment F2 to the fourth segment F4. Referring to FIG. 3A, FIG. 6A, FIG. 6B, FIG. 6C, and FIG. 4B, the third segment F3 is a segment of the respective voltage supply line that is connected to an interference preventing block IPB through a thud via v3 extending through the inter-layer dielectric layer ILD.

Referring to FIG. 4F, in some embodiments, an orthographic projection of the first segment F1 on the base substrate BS is at least partially overlapping with an orthographic projection of the active layer ACT3 of the third transistor T3 on the base substrate BS and at least partially overlapping with an orthographic projection of the respective gate line of the plurality of gate lines GL on the base substrate BS. An orthographic projection of the fourth segment F4 on the base substrate BS is at least partially overlapping with an orthographic projection of a respective reset control signal line (e.g., the respective reset control signal line rstN in a present stage) on the base substrate BS.

Referring to FIG. 6C, the second segment F2 has an average line width of wf2. The third segment F3 has air average line width of wf3. Optionally, the average line width of wf3 is greater than the average line width of wf2.

Figure 6D:
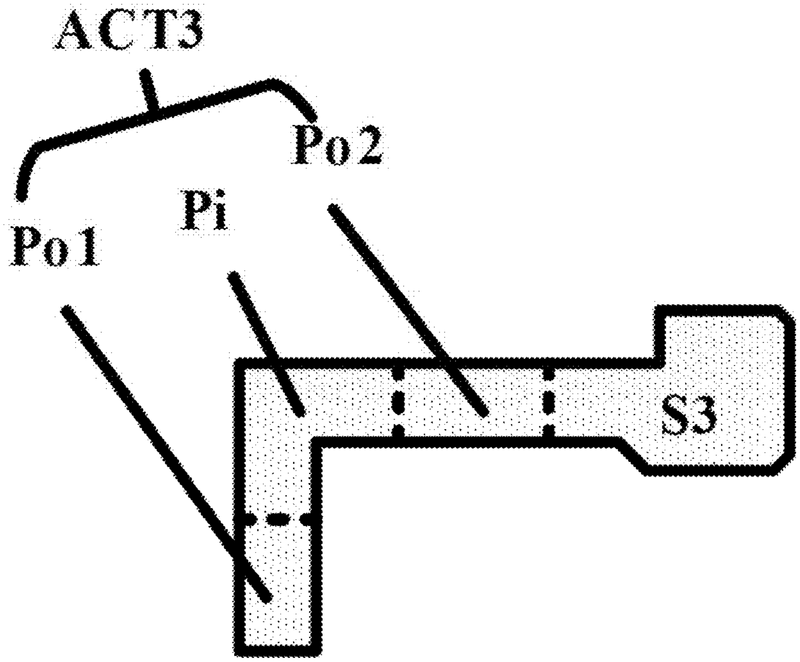
FIG. 6D is a diagram illustrating a partial structure of a semiconductor material layer in a respective subpixel in FIG. 6A.

FIG. 6D is a diagram illustrating a partial structure of a semiconductor material layer in a respective subpixel in FIG. 6A. Referring to FIG. 3A, FIG. 6A, FIG. 6B, FIG. 6C, and FIG. 6D, in some embodiments, the active layer ACT3 of the third transistor T3 includes a first overlapping portion Po1, a second overlapping portion Po2, and an intermediate portion Pi connecting the first overlapping portion Po1 and the second overlapping portion Po2. Referring to FIG. 4F, an orthographic projection of the first overlapping portion Po1 on the base substrate BS is covered by an orthographic projection of the respective gate line of the plurality of gate lines GL on the base substrate BS. Referring to FIG. 4A, an orthographic projection of the second overlapping portion Po2 cm the base substrate BS is covered by an orthographic projection of the gate protrusion GP on the base substrate BS. Referring to FIG. 4F, an orthographic projection of the intermediate portion Pi on the base substrate BS is at least partially overlapping with an orthographic projection of the respective gate line of the plurality of gate lines GL on the base substrate BS.

Referring to FIG. 3A, FIG. 6A, FIG. 6B, FIG. 6C, FIG. 6D, and FIG. 4F, in some embodiments, an orthographic projection of the first overlapping portion Po1 on the base substrate BS is at least partially overlapping with an orthographic projection of the main portion MP on the base substrate BS. Referring to FIG. 3A, FIG. 6A, FIG. 6B, FIG. 6C, FIG. 6D, and FIG. 4A, in some embodiments, an orthographic projection of the second overlapping portion Po2 on the base substrate BS is at least partially overlapping with the orthographic projection of the gate protrusion GP on the base substrate BS. Referring to FIG. 3A, FIG. 6A, FIG. 6B. FIG. 6C, FIG. 6D, FIG. 4A, and FIG. 4F, in some embodiments, an orthographic projection of the intermediate portion Pi on the base substrate BS is non-overlapping with an orthographic projection of the respective gate line on the base substrate BS. Optionally, the orthographic projection of the respective voltage supply line of the plurality of voltage supply lines Vdd on the base substrate BS is at least partially overlapping with the orthographic projection of the intermediate portion Pi on the base substrate BS, and is at least partially overlapping with the orthographic projection of the first overlapping portion Po1 on the base substrate BS.

The inventors of the present disclosure discover that, overlapping between the plurality of voltage supply lines Vdd and the plurality of reset control signal line increases loading in the plurality of reset control signal line. Reducing the overlapping area between the plurality of voltage supply lines Vdd and the plurality of reset control signal line can effectively reduce loading in the plurality of reset control signal line, achieving faster response and enhancing image display quality.

Accordingly, the respective voltage signal line in the present disclosure is one having non-uniform line width. For example, a portion of the respective voltage signal line crossing over a respective reset control signal line has a line width smaller than those of the portions immediately adjacent to the portion crossing over the respective reset control signal line. The intricate structure of the respective voltage signal line in the present disclosure reduces overlapping between the respective voltage signal line and the respective reset control signal line, thereby reducing the parasitic capacitance between the respective voltage supply line and the respective reset control signal line.

Referring to FIG. 3A. FIG. 6A, FIG. 6B, FIG. 6C, and FIG. 6D, in some embodiments, in a respective subpixel, a respective voltage supply line includes contiguously a third segment F3, a fourth segment F4, and a fifth segment F5. The fourth segment F4 connects the third segment F3 and the fitly segment F5. In some embodiments, the fourth segment F4 crosses over a respective reset control signal line (e.g., the respective reset control signal line rstN in a present stage or the respective reset control signal line rst(N+1) in a next stage). An orthographic projection of the fourth segment F4 on the base substrate BS is at least partially overlapping with an orthographic projection of a respective reset control signal line on the base substrate BS.

Referring to FIG. 6C, in some embodiments, the third segment F3 has an average line width wf3; the fourth segment F4 has an average line width wf4; and the fifth segment F5 has an average line width wf5. Optionally, the average line width wf4 is smaller than the average line width wf3, and is smaller than the average line width wf5.

Referring to FIG. 3A, FIG. 6A, FIG. 6B, FIG. 6C, FIG. 6D, and FIG. 4F, in some embodiments, an orthographic projection of the fifth segment F5 on the base substrate BS is at least partially overlapping with an orthographic projection of a respective reset signal line (e.g., the respective reset signal line VintN in the present stage or the respective reset signal line Vint(N+1) in the next stage) on the base substrate BS. Referring to FIG. 3A, FIG. 6A, FIG. 6B, FIG. 6C, and FIG. 4B, the thud segment F3 is a segment of the respective voltage supply line that is connected to an interference preventing block IPB through a third via v3 extending through the inter-layer dielectric layer ILD.

Figure 4G:
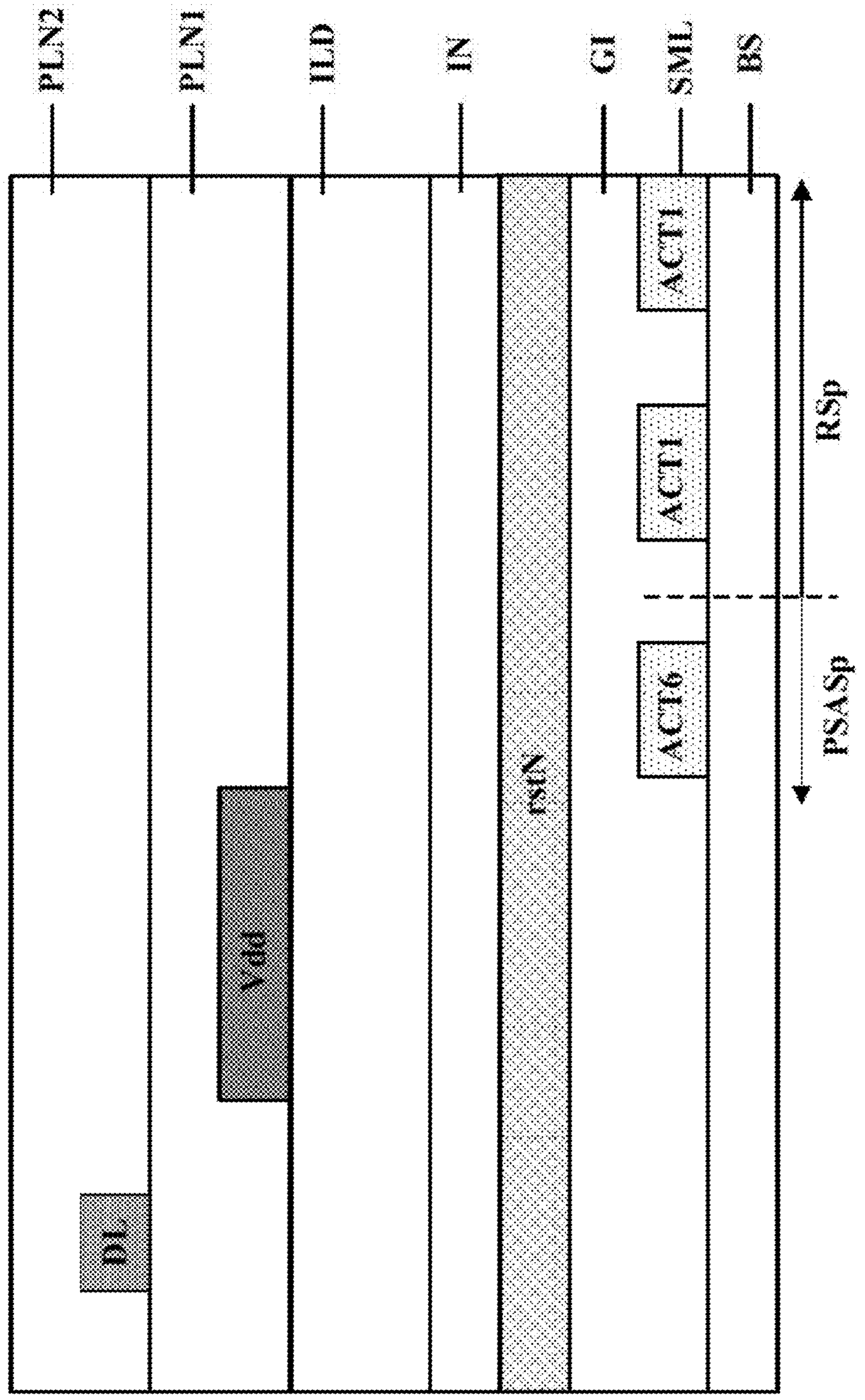
FIG. 4G is a cross-sectional view along a G-G' line in FIG. 3A.

FIG. 4G is a cross-sectional view along a G-G' line in FIG. 3A. Referring to FIG. 3A, FIG. 6A. FIG. 6B, FIG. 6C, FIG. 6D, and FIG. 4G, in a subpixel PSASp in a previous stage and immediately adjacent to the respective subpixel RSp, the semiconductor material layer includes an active layer ACT6 of a sixth transistor T6. An orthographic projection of the respective reset control signal line (e.g., the respective reset control signal line in the present stage rstN) on the base substrate BS is at least partially overlapping with the orthographic projection of the active layer ACT6 of the sixth transistor T6 on the base substrate BS. In some embodiments, at least 80% (e.g., at least 85%, at least 90%, at least 95%, at least 99%, or 100%) of the orthographic projection of the active layer ACT6 of the sixth transistor T6 in the subpixel PSASp in the previous stage on the base substrate BS is non-overlapping with an orthographic projection of the fourth segment F4 on the base substrate BS. Referring to FIG. 4G, the orthographic projection of the active layer ACT6 of the sixth transistor T6 in the subpixel PSASp in the previous stage on the base substrate BS is non-overlapping with an orthographic projection of the fourth segment F4 on the base substrate BS.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating an array substrate. In some embodiments, the method includes forming a semiconductor material layer on a base substrate; and forming a plurality of voltage supply lines on a side of the semiconductor material layer away from the base substrate. Optionally, in a respective subpixel, the semiconductor material layer is formed to include an active layer of a third transistor, an active layer of a fifth transistor, an active layer of a driving transistor, and a third node portion. The third node portion is formed to be connected to the active layer of the third transistor, the active layer of the fifth transistor, and the active layer of the driving transistor in the respective subpixel. Optionally, at least 30% of an orthographic projection of the third node portion on the base substrate is non-overlapping with an orthographic projection of a respective voltage supply line on the base substrate.

In some embodiments, the method of fabricating an array substrate includes forming a semiconductor material layer on a base substrate; forming a plurality of gate lines on a side of the semiconductor material layer away from the base substrate; and forming a plurality of voltage supply lines on a side of the plurality of gate lines away from the base substrate. Optionally, in a respective subpixel, a respective gate line is formed to include a main portion extending along an extension direction of the respective gate line, and a gate protrusion protruding away from the main portion. Optionally, in the respective subpixel, the semiconductor material layer is formed to include an active layer of a third transistor. Optionally, an orthographic projection of the gate protrusion on the base substrate at least partially overlaps with an orthographic projection of the active layer of the third transistor on the base substrate. Optionally, at least 90% of the orthographic projection of the gate protrusion on the base substrate is non-overlapping with an orthographic projection of a respective voltage supply line on the base substrate.

In some embodiments, the method of fabricating an array substrate includes forming a plurality of reset control signal lines on the base substrate; and forming a plurality of voltage supply lines on a side of the plurality of reset control signal lines away from the base substrate. Optionally, in a respective subpixel, a respective voltage supply line is formed to include a third segment, a fourth segment, and a fifth segment contiguously arranged. Optionally, the fourth segment is formed to connect the third segment and the fifth segment. Optionally, an orthographic projection of the fourth segment on the base substrate is at least partially overlapping with an orthographic projection of a respective reset control signal line on the base substrate. Optionally, the fourth segment has an average line width smaller than an average line width of the third segment and smaller than an average line width of the fifth segment.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first”, “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:

a base substrate;

a semiconductor material layer on the base substrate;

a node connecting line on a side of the semiconductor material layer away from the base substrate; and a plurality of voltage supply lines and a plurality of data lines on a side of the semiconductor material layer away from the base substrate;

wherein, in a respective subpixel, the semiconductor material layer comprises an active layer of a third transistor, an active layer of a fifth transistor, an active layer of a driving transistor, and a third node portion that is connected to the active layer of the third transistor, the active layer of the fifth transistor, and the active layer of the driving transistor in the respective subpixel;

at least 30% of an orthographic projection of the third node portion on the base substrate is non-overlapping with an orthographic projection of a respective voltage supply line on the base substrate;

the orthographic projection of the third node portion on the base substrate at least partially overlaps with the orthographic projection of the respective voltage supply line on the base substrate;

an orthographic projection of the active layer of the third transistor on the base substrate is covered by an orthographic projection of a gate electrode of the third transistor on the base substrate;

an orthographic projection of the active layer of the fifth transistor on the base substrate is covered by an orthographic projection of a gate electrode of the fifth transistor on the base substrate, at least partially overlaps with the orthographic projection of the respective voltage supply line on the base substrate, and is at least partially non-overlapping with the orthographic projection of the respective voltage supply line on the base substrate;

for any portion of the active layer of the fifth transistor whose orthographic projection on the base substrate at least partially overlaps with the orthographic projection of the respective voltage supply line on the base substrate and is at least partially non-overlapping with the orthographic projection of the respective voltage supply line on the base substrate, the orthographic projection on the base substrate is covered by the orthographic projection of the gate electrode of the fifth transistor on the base substrate; and the fifth transistor is a transistor comprising a drain electrode connected to an anode of a light emitting element;

wherein the node connecting line connects a first capacitor electrode of a storage capacitor and a source electrode of the third transistor in the respective subpixel together;

the respective voltage supply line is connected to a source electrode of a fourth transistor in a subpixel adjacent to the respective subpixel;

a data line of the plurality of data lines is configured to provide a data signal to the respective subpixel; and an orthographic projection the node connecting line on the base substrate spaces apart the orthographic projection of the respective voltage supply line on the base substrate from an orthographic projection of the data line on the base substrate.

2. The array substrate of claim 1, wherein the third node portion comprises contiguously a first portion and a second portion;

the first portion is connected to the active layer of the fifth transistor, the active layer of the driving transistor, and the second portion;

the second portion connects the first portion to the active layer of the third transistor; and an orthographic projection of the first portion is non-overlapping with the orthographic projection of the respective voltage supply line on the base substrate; and an orthographic projection of the second portion at least partially overlaps with the orthographic projection of the respective voltage supply line on the base substrate.

3. The array substrate of claim 2, further comprising:

a gate insulating layer on a side of the semiconductor material layer away from the base substrate; and a plurality of gate lines on a side of the gate insulating layer away from the base substrate;

wherein an orthographic projection of the active layer of the third transistor on the base substrate overlaps with an orthographic projection of a respective gate line on the base substrate; and an orthographic projection of the active layer of the fifth transistor on the base substrate overlaps with an orthographic projection of a respective light emitting control signal line on the base substrate.

4. The array substrate of claim 2, wherein, in the respective subpixel, the respective voltage supply line comprises contiguously a first wide portion, a narrow portion, and a second wide portion;

wherein an orthographic projection of the first wide portion on the base substrate is at least partially overlapping with an orthographic projection of the second portion on the base substrate;

an orthographic projection of the narrow portion on the base substrate is non-overlapping with an orthographic projection of the semiconductor material layer on the base substrate;

an orthographic projection of the second wide portion on the base substrate is at least partially overlapping with an orthographic projection of the active layer of the fifth transistor on the base substrate and an orthographic projection of a respective light emitting control signal line on the base substrate; and the narrow portion has an average line width smaller than an average line width of the first wide portion and smaller than an average line width of the second wide portion.

5. The array substrate of claim 4, further comprising:

an insulating layer on a side of the semiconductor material layer away from the base substrate;

a second capacitor electrode of a storage capacitor on a side of the insulating layer away from the base substrate; and an inter-layer dielectric layer on a side of the second capacitor electrode away from the base substrate;

wherein the first wide portion connects to the second capacitor electrode of a storage capacitor through a ninth via extending through the inter-layer dielectric layer.

6. The array substrate of claim 4, wherein, in the respective subpixel, the respective voltage supply line further comprises a first segment connected to the first wide portion; and an orthographic projection of the first segment on the base substrate is at least partially overlapping with an orthographic projection of the active layer of the third transistor on the base substrate and an orthographic projection of a respective gate line on the base substrate.

7. The array substrate of claim 1, wherein, in an adjacent subpixel immediately adjacent to the respective subpixel, the semiconductor material layer comprises an active layer of a second transistor, an active layer of a fourth transistor, an active layer of a driving transistor, and a second node portion that is connected to the active layer of the second transistor, the active layer of the fourth transistor, and the active layer of the driving transistor in the adjacent subpixel; and an orthographic projection of the second node portion on the base substrate is non-overlapping with the orthographic projection of the respective voltage supply line on the base substrate.

8. The array substrate of claim 7, wherein at least a narrow portion of the respective voltage supply line in the respective subpixel is between the second node portion and the third node portion; and an orthographic projection of the narrow portion on the base substrate is non-overlapping with an orthographic projection of the second node portion on the base substrate, and is non-overlapping with an orthographic projection of the third node portion on the base substrate.

9. The array substrate of claim 1, further comprising a plurality of gate lines on a side of the semiconductor material layer away from the base substrate;

wherein, in the respective subpixel, a respective gate line comprises a main portion extending along an extension direction of the respective gate line, and a gate protrusion protruding away from the main portion;

an orthographic projection of the gate protrusion on the base substrate at least partially overlaps with an orthographic projection of the active layer of the third transistor on the base substrate;

at least 90% of the orthographic projection of the gate protrusion on the base substrate is non-overlapping with an orthographic projection of a respective voltage supply line on the base substrate; and an orthographic projection of the main portion on the base substrate at least partially overlaps the orthographic projection of the respective voltage supply line on the base substrate.

10. The array substrate of claim 1, further comprising a plurality of reset control signal lines on a side of the semiconductor material layer away from the base substrate;

wherein, in the respective subpixel, the respective voltage supply line comprises contiguously a third segment, a fourth segment, and a fifth segment, the fourth segment connecting the third segment and the fifth segment;

an orthographic projection of the fourth segment on the base substrate is at least partially overlapping with an orthographic projection of a respective reset control signal line on the base substrate; and the fourth segment has an average line width smaller than an average line width of the third segment and smaller than an average line width of the fifth segment.

11. The array substrate of claim 1, further comprising:

a plurality of reset control signal lines on the base substrate;

wherein the plurality of voltage supply lines are on a side of the plurality of reset control signal lines away from the base substrate;

wherein, in a respective subpixel, the respective voltage supply line comprises contiguously a third segment, a fourth segment, and a fifth segment, the fourth segment connecting the third segment and the fifth segment;

an orthographic projection of the fourth segment on the base substrate is at least partially overlapping with an orthographic projection of a respective reset control signal line on the base substrate; and the fourth segment has an average line width smaller than an average line width of the third segment and smaller than an average line width of the fifth segment.

12. The array substrate of claim 11, further comprising a plurality of reset signal lines on a side of the plurality of reset control signal lines away from the base substrate;

wherein an orthographic projection of the fifth segment on the base substrate is at least partially overlapping with an orthographic projection of a respective reset signal line on the base substrate.

13. The array substrate of claim 11, further comprising:

an interference preventing block on a side of the plurality of reset control signal lines away from the base substrate; and an inter-layer dielectric layer on a side of the interference preventing block away from the base substrate;

wherein the third segment connects to an interference preventing block through a third via extending through the inter-layer dielectric layer.

14. The array substrate of claim 11, wherein, in a subpixel in a previous stage and immediately adjacent to the respective subpixel, the semiconductor material layer comprises an active layer of a sixth transistor; and an orthographic projection of the respective reset control signal line on the base substrate is at least partially overlapping with the orthographic projection of the active layer of the sixth transistor on the base substrate; and at least 80% of the orthographic projection of the active layer of the sixth transistor in the subpixel in the previous stage on the base substrate is non-overlapping with an orthographic projection of the fourth segment on the base substrate.

15. A display apparatus, comprising the array substrate of claim 1, and an integrated circuit connected to the array substrate.

16. The array substrate of claim 1, further comprising:

an interference preventing block on the base substrate;

wherein the respective voltage supply line is further connected to the interference preventing block in the respective subpixel; and an orthographic projection of the interference preventing block on the base substrate partially overlaps with the orthographic projection of the respective voltage supply line of the plurality of voltage supply lines on the base substrate; and the orthographic projection of the interference preventing block on the base substrate at least partially overlaps with the orthographic projection of the active layer of the third transistor on the base substrate.

17. An array substrate, comprising:

a base substrate;

a semiconductor material layer on the base substrate;

a plurality of gate lines on a side of the semiconductor material layer away from the base substrate;

a node connecting line on a side of the semiconductor material layer away from the base substrate; and a plurality of voltage supply lines and a plurality of data lines on a side of the plurality of gate lines away from the base substrate;

wherein, in a respective subpixel, a respective gate line comprises a main portion extending along an extension direction of the respective gate line, and a gate protrusion protruding away from the main portion;

wherein, in the respective subpixel, the semiconductor material layer comprises an active layer of a third transistor;

an orthographic projection of the gate protrusion on the base substrate at least partially overlaps with an orthographic projection of the active layer of the third transistor on the base substrate;

at least 90% of the orthographic projection of the gate protrusion on the base substrate is non-overlapping with an orthographic projection of a respective voltage supply line on the base substrate;

an orthographic projection of the main portion on the base substrate at least partially overlaps the orthographic projection of the respective voltage supply line on the base substrate;

an orthographic projection of the active layer of the third transistor on the base substrate is covered by an orthographic projection of a gate electrode of the third transistor on the base substrate;

an orthographic projection of an active layer of a fifth transistor on the base substrate is covered by an orthographic projection of a gate electrode of the fifth transistor on the base substrate, at least partially overlaps with the orthographic projection of the respective voltage supply line on the base substrate, and is at least partially non-overlapping with the orthographic projection of the respective voltage supply line on the base substrate;

for any portion of the active layer of the fifth transistor whose orthographic projection on the base substrate at least partially overlaps with the orthographic projection of the respective voltage supply line on the base substrate and is at least partially non-overlapping with the orthographic projection of the respective voltage supply line on the base substrate, the orthographic projection on the base substrate is covered by the orthographic projection of the gate electrode of the fifth transistor on the base substrate; and the fifth transistor is a transistor comprising a drain electrode connected to an anode of a light emitting element;

wherein the node connecting line connects a first capacitor electrode of a storage capacitor and a source electrode of the third transistor in the respective subpixel together;

the respective voltage supply line is connected to a source electrode of a fourth transistor in a subpixel adjacent to the respective subpixel;

a data line of the plurality of data lines is configured to provide a data signal to the respective subpixel; and an orthographic projection the node connecting line on the base substrate spaces apart the orthographic projection of the respective voltage supply line on the base substrate from an orthographic projection of the data line on the base substrate.

18. The array substrate of claim 17, wherein the orthographic projection of the gate protrusion on the base substrate is non-overlapping with the orthographic projection of the respective voltage supply line on the base substrate.

19. The array substrate of claim 17, further comprising:

a plurality of reset control signal lines on a side of the semiconductor material layer away from the base substrate;

an interference preventing block on a side of the plurality of reset control signal lines away from the base substrate; and an inter-layer dielectric layer on a side of the interference preventing block away from the base substrate;

wherein, in the respective subpixel, the respective voltage supply line comprises contiguously a first segment, a second segment, a third segment, and a fourth segment;

wherein an orthographic projection of the first segment on the base substrate is at least partially overlapping with an orthographic projection of the active layer of the third transistor on the base substrate and at least partially overlapping with an orthographic projection of the respective gate line on the base substrate;

an orthographic projection of the fourth segment on the base substrate is at least partially overlapping with an orthographic projection of a respective reset control signal line on the base substrate;

the second segment connects the first segment to the third segment;

the third segment connects the second segment to the fourth segment; and the third segment is connected to an interference preventing block through a third via extending through the inter-layer dielectric layer.

20. The array substrate of claim 19, wherein the third segment has an average line width greater than an average line width of the second segment.

* * * * *